US 12,501,814 B2

(12) United States Patent
Jung

(10) Patent No.: US 12,501,814 B2
(45) Date of Patent: Dec. 16, 2025

(54) DISPLAY PANEL AND DISPLAY DEVICE

(71) Applicant: LG Display Co., Ltd., Seoul (KR)

(72) Inventor: YuHo Jung, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 398 days.

(21) Appl. No.: 18/186,034

(22) Filed: Mar. 17, 2023

(65) Prior Publication Data
US 2023/0301158 A1    Sep. 21, 2023

(30) Foreign Application Priority Data

Mar. 18, 2022    (KR) .................. 10-2022-0033802

(51) Int. Cl.
*H10K 59/65*     (2023.01)
*H10D 30/67*     (2025.01)
*H10K 59/124*    (2023.01)
*H10K 59/131*    (2023.01)
*H10K 59/38*     (2023.01)
*H10K 59/40*     (2023.01)
*H10K 59/80*     (2023.01)

(52) U.S. Cl.
CPC ......... *H10K 59/65* (2023.02); *H10D 30/6745* (2025.01); *H10D 30/6755* (2025.01); *H10K 59/124* (2023.02); *H10K 59/131* (2023.02); *H10K 59/38* (2023.02); *H10K 59/40* (2023.02); *H10K 59/873* (2023.02)

(58) Field of Classification Search
None
See application file for complete search history.

(56) References Cited

U.S. PATENT DOCUMENTS

| 2016/0013415 | A1  |  1/2016 | Ren |
| 2021/0408184 | A1  | 12/2021 | Hu  |
| 2023/0064771 | A1* |  3/2023 | Cho ............. G09G 3/3233 |

FOREIGN PATENT DOCUMENTS

| KR | 20180075055 A | 7/2018 |
| KR | 20200035196 A | 4/2020 |
| KR | 20200093718 A | 8/2020 |
| KR | 20210078931 A | 6/2021 |
| KR | 20220024364 A | 3/2022 |

* cited by examiner

*Primary Examiner* — Kyoung Lee
(74) *Attorney, Agent, or Firm* — Seed Intellectual Property Law Group LLP

(57) ABSTRACT

Provided are a display panel and a display device having a structure by which processing is simplified. The display panel includes a substrate which includes a display area including a first optical area, the first optical area including a central area and a bezel area of the optical area that is located outside of the central area, and a normal area located outside of the first optical area. A plurality of emitting devices are disposed in the central area; a plurality of emitting devices disposed in the bezel area of the optical area; a plurality of transistors disposed in the bezel area of the optical area and including a plurality of source-drain electrode patterns and a plurality of active layers; a connection pattern formed of the same material as at least one among the plurality of active layers and connected to at least one among the plurality of emitting devices disposed in the central area.

31 Claims, 18 Drawing Sheets

DISPLAY PANEL AND DISPLAY DEVICE

CROSS-REFERENCE TO RELATED APPLICATION

This application claims priority from Korean Patent Application No. 10-2022-0033802, filed on Mar. 18, 2022, which is hereby incorporated by reference for all purposes as if fully set forth herein.

BACKGROUND

Technical Field

Embodiments relate to a display panel and a display device and, more particularly, to a display panel and a display device able to simplify processing while improving the transmittance of an area in which an optical device is disposed.

Description of Related Art

Along with technological development, a display device may provide an image capturing function, a variety of detection functions, or the like, in addition to an image display function. In this regard, the display device is required to be provided with an optoelectronic device (also referred to as a light receiving device or a sensor) such as a camera or a detection sensor.

The optoelectronic device is required to receive light from the front surface of the display device and accordingly, be disposed in a location in which light reception is advantageous. Thus, conventionally, a camera (more particularly, a camera lens) and a detection sensor have been disposed on the front surface of a display device so as to be disclosed externally. As a result, the bezel of the display panel may be widened or a notch or a physical hole may be formed in a display area of the display panel in order to accommodate the camera or the detection sensor.

As an optoelectronic device, such as a camera or a detection sensor, performing a predetermined function by receiving light may be disposed on the display device, the size of the bezel on the front surface of the display device may be increased or a degree of design freedom of the front surface of the display device may be limited.

BRIEF SUMMARY

In the display technology field, research into technology enabling a display to be provided with an optoelectronic device, such as a camera and a detection sensor, without reducing the size of a display area of a display panel has been undertaken. In this regard, the inventors of the present disclosure have invented a display panel and a display device having a light transmission structure by which an optoelectronic device provided below a display area of the display panel may normally receive light without being exposed on the front of the display device.

In addition, the inventors of the present disclosure have invented a display panel and a display device having high transmittance in an area in which the optoelectronic device is disposed.

Embodiments of the present disclosure may provide a display panel and a display device in which an optoelectronic device, such as a camera and a detection sensor, may be provided below the display panel to reduce a non-display area of the display panel while being disposed so as not to be exposed on the front of the display device.

Embodiments of the present disclosure may provide a display panel and a display device having a light transmission structure by which the optoelectronic device located below the display area of the display panel may normally receive light.

Embodiments of the present disclosure may provide a display panel and a display device in which normal display driving may be enabled in an optical area included in the display area of the display panel, with the optoelectronic device overlapping the optical area.

A display device according to an embodiment of the present disclosure may include a display panel and a display driver circuit for driving the display panel, the display panel including: a substrate including a display area including a first optical area, the first optical area including a central area and a bezel area of the optical area located outside of the central area, and a normal area located outside of the first optical area; a plurality of light emitting devices disposed on the substrate in the central area; a plurality of light emitting devices disposed on the substrate in the bezel area; a plurality of transistors disposed on the substrate in the bezel area and including a plurality of source-drain electrode patterns and a plurality of active layers; and a connection pattern formed of the same material as at least one active layer among the plurality of active layers and connected to at least one light emitting device among the plurality of light emitting devices disposed in the central area.

A display panel according to another embodiment of the present disclosure may include: a substrate including a display area including a first optical area, the first optical area including a central area and a bezel area located outside of the central area, and a normal area located outside of the first optical area; a plurality of emitting devices disposed in the central area; a plurality of emitting devices disposed in the bezel area; a plurality of transistors disposed in the bezel area and including a plurality of source-drain electrode patterns and a plurality of active layers; and a connection pattern formed of the same material as at least one active layer among the plurality of active layers and connected to at least one emitting device among the plurality of emitting devices disposed in the central area.

According to embodiments, in the display panel and the display device, the optoelectronic device, such as a camera and a detection sensor, may be provided below the display area of the display panel to reduce a non-display area of the display panel while being disposed so as not to be exposed on the front of the display device.

In addition, according to embodiments, in the display panel and the display device, the plurality of transistors may be disposed in the bezel area of the optical area while not being disposed in the central area of the optical area so as to improve the transmittance of the central area.

In addition, according to embodiments, in the display panel and the display device, an active connection pattern is formed in the central area of the first optical area, concurrently in a process of forming a first active area in the normal area and a third active layer and a fifth active layer in the bezel area of the first optical area. Accordingly, the thickness of the display panel and the display device may be reduced and the process may be simplified.

In addition, according to embodiments, the display panel and the display device may have a light transmission structure by which the optoelectronic device located below the display area of the display panel may normally receive light.

In addition, according to embodiments, in the display panel and the display device, normal display driving may be enabled in an optical area included in the display area of the display panel, with the optoelectronic device overlapping the optical area.

The effects of the present disclosure are not limited to the aforementioned description, and other effects not explicitly disclosed herein will be clearly understood by those having ordinary knowledge in the technical field, to which the present disclosure pertains, from the description provided hereinafter.

DESCRIPTION OF THE SEVERAL VIEWS OF THE DRAWINGS

The above and other objectives, features, and advantages of the present disclosure will be more clearly understood from the following detailed description, taken in conjunction with the accompanying drawings, in which.

DETAILED DESCRIPTION

Figure 1A:
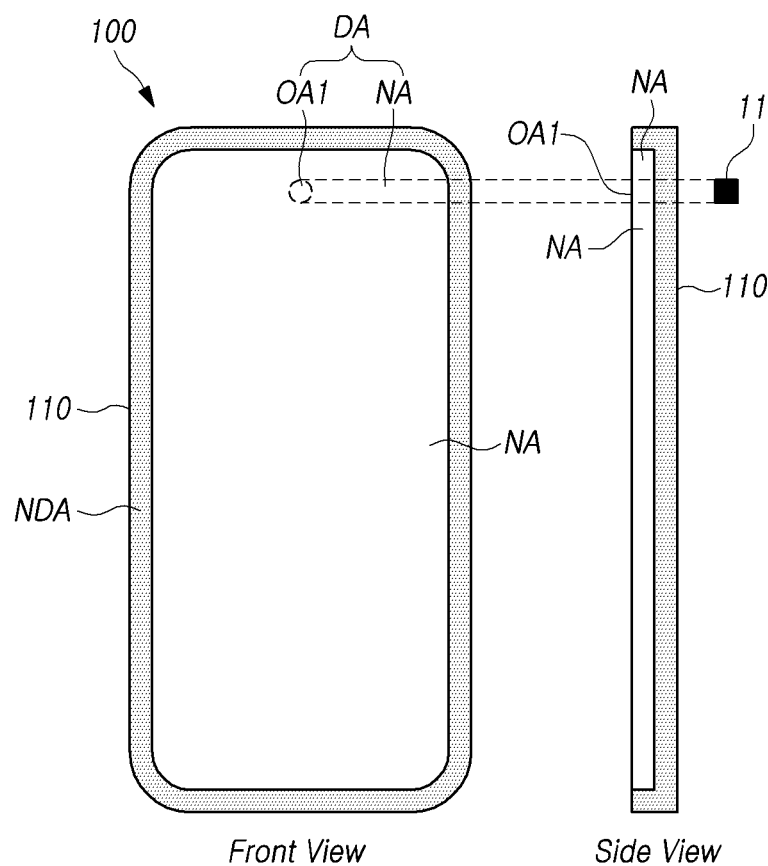
FIGS. 1A, 1B, 1C, and 1D are plan diagrams illustrating a display device according to embodiments of the present disclosure.

The advantages and features of the present disclosure and methods of the realization thereof will be apparent with reference to the accompanying drawings and detailed descriptions of embodiments. The present disclosure should not be construed as being limited to the embodiments set forth hereinafter and may be embodied in a variety of different forms. Rather, these embodiments are provided so that the present disclosure will be thorough and complete, and will fully convey the scope of the present disclosure to those having ordinary knowledge in the technical field.

The shapes, sizes, ratios, angles, numbers, and the like, inscribed in the drawings to illustrate embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted when it is determined that the description may make the subject matter in some embodiments of the present disclosure rather unclear. It will be understood that the terms "comprise", "include", "have", and any variations thereof used herein are intended to cover non-exclusive inclusions unless explicitly stated to the contrary. Descriptions of components in the singular form used herein are intended to include descriptions of components in the plural form, unless explicitly stated to the contrary.

In the analysis of a component, it shall be understood that an error range is included therein, even in the situation in which there is no explicit description thereof.

When spatially relative terms, such as "on", "above", "under", "below", and "on a side of", are used herein for descriptions of relationships between one element or component and another element or component, one or more intervening elements or components may be present between the one and other elements or components, unless a term, such as "immediately" or "directly", is used.

When describing signal flow, for example, "transmission of a signal from node A to node B", a case in which a signal is transmitted from node A to node B through one or more intervening nodes may be included, unless the term "immediately" or "directly" is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of example embodiments of the present disclosure may be partially or entirely coupled or combined with each other and may work in concert with each other or may operate in a variety of technical methods. In addition, respective example embodiments may be carried out independently or may be associated with and carried out in concert with other embodiments.

Hereinafter, a variety of embodiments will be described in detail with reference to the accompanying drawings.

FIGS. 1A, 1B, 1C, and 1D are plan diagrams illustrating a display device 100 according to embodiments of the present disclosure;

Referring to FIGS. 1A to 1D, the display device 100 according to embodiments of the present disclosure may include a display panel 110 to display an image and one or more optoelectronic devices 11 and 12.

The display panel 110 may include a display area DA on which images are displayed and a non-display area NDA on which no images are displayed.

On the display area DA, a plurality of subpixels and a variety of signal lines for driving the plurality of subpixels may be disposed.

The non-display area NDA may be an area outside the display area DA. On the non-display area NDA, a variety of signal lines may be disposed and a variety of driver circuits may be connected. The non-display area NDA may be bent so as not to be seen from the front or covered with a housing (not shown). The non-display area NDA is also referred to as a bezel or a bezel area.

Referring to FIGS. 1A to 1D, in the display device 100 according to embodiments of the present disclosure, the one or more optoelectronic devices 11 and 12 are electronic components located below (i.e., on a side opposite to the viewing side of) the display panel 110.

Light may enter the display panel 110 through the front side (i.e., the viewing side), pass through the display panel 110, and reach the one or more optoelectronic devices 11 and 12 located below (i.e., on the side opposite to the viewing side of) the display panel 110.

The one or more optoelectronic devices 11 and 12 may be devices respectively receiving light that has passed through the display panel 110 and performing a predetermined function in response to the received light. For example, the one or more optoelectronic devices 11 and 12 may include at least one among image-capturing devices such as a camera (or an image sensor) and sensors such as a proximity sensor and a light sensor.

Referring to FIGS. 1A to 1D, in the display panel 110 according to embodiments of the present disclosure, the display area DA may include a normal area NA and one or more optical areas OA1 and OA2.

Referring to FIGS. 1A to 1D, each of the one or more optical areas OA1 and OA2 may be an area overlapping at least one of the one or more optoelectronic devices 11 and 12.

According to the illustration of FIG. 1A, the display area DA may include the normal area NA and the first optical area OA1. At least a portion of the first optical area OA1 may overlap the first optoelectronic device 11.

The first optical area OA1 having a circular structure is illustrated in FIG. 1A, but the shape of the first optical area OA1 according to embodiments of the present disclosure is not limited thereto.

Figure 1B:
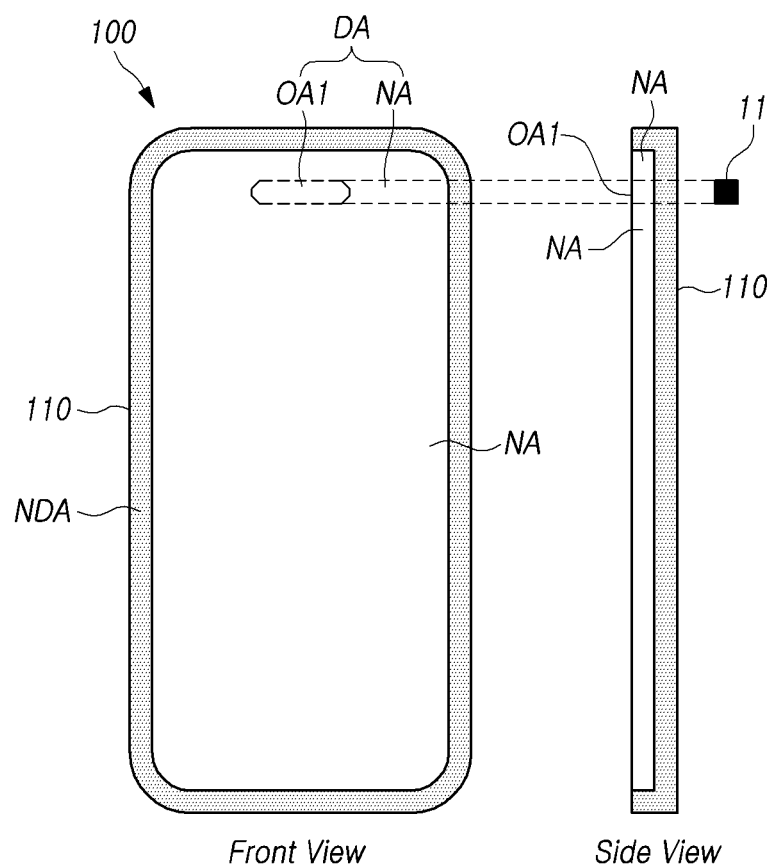

For example, as illustrated in FIG. 1B, the first optical area OA1 may have an octagonal shape, and may also have any one of a variety of other polygonal shapes.

Figure 1C:
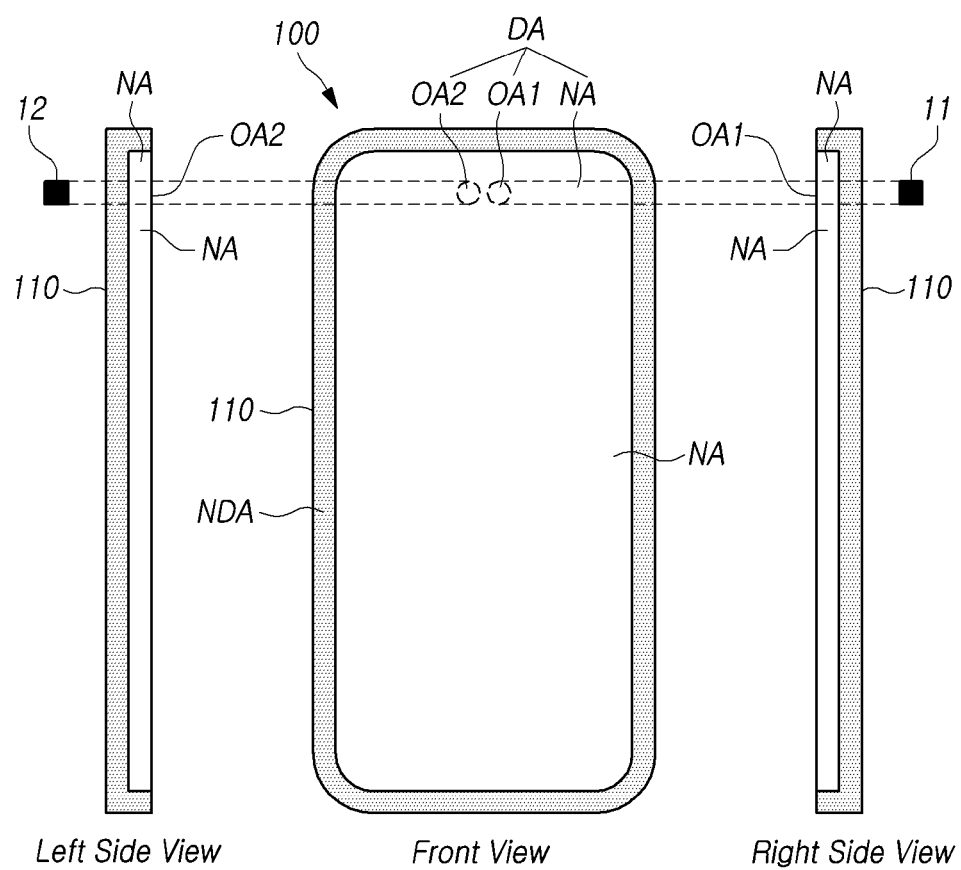

According to the illustration of FIG. 1C, the display area DA may include the normal area NA, the first optical area OA1, and the second optical area OA2. In the illustration of FIG. 1C, the normal area NA is present between the first optical area OA1 and the second optical area OA2. At least a portion of the first optical area OA1 may overlap the first optoelectronic device 11, and at least a portion of the second optical area OA2 may overlap the second optoelectronic device 12.

Figure 1D:
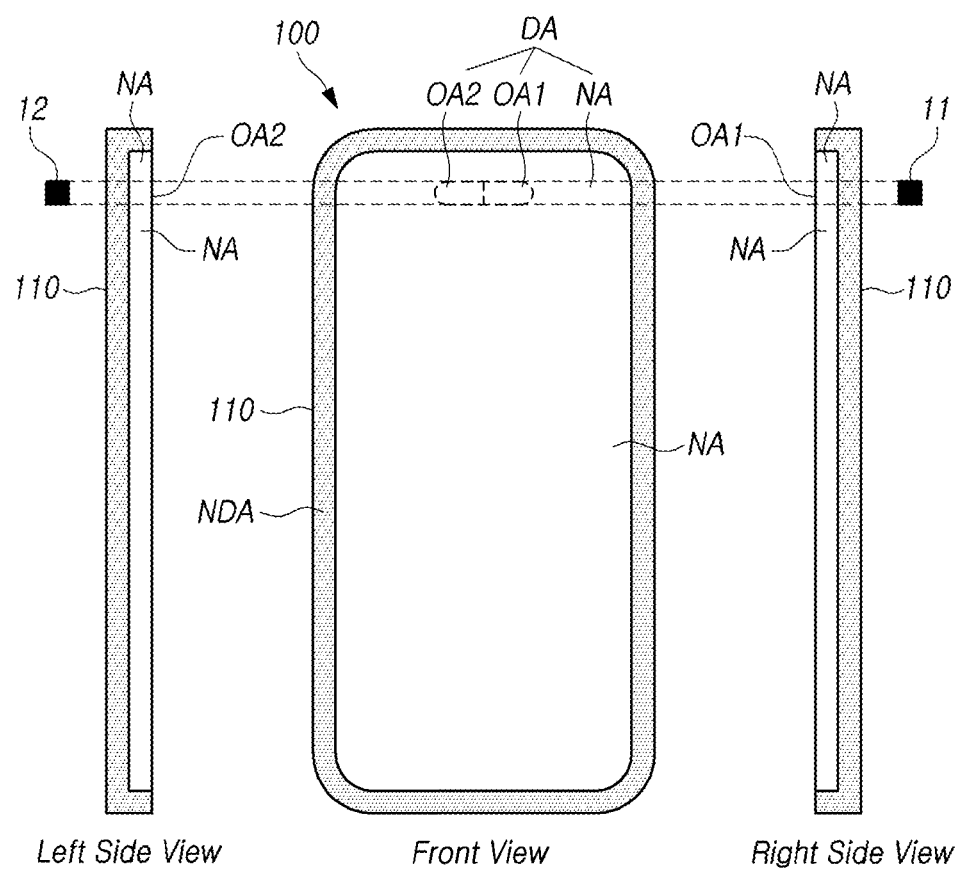

According to the illustration of FIG. 1D, the display area DA may include the normal area NA, the first optical area OA1, and the second optical area OA2. In the illustration of FIG. 1D, the normal area NA is not present between the first optical area OA1 and the second optical area OA2. That is, the first optical area OA1 and the second optical area OA2 are in contact with each other. At least a portion of the first optical area OA1 may overlap the first optoelectronic device 11, and at least a portion of the second optical area OA2 may overlap the second optoelectronic device 12.

The one or more optical areas OA1 and OA2 are required to have both an image-displaying structure and a light-transmitting structure. That is, since one or more optical areas OA1 and OA2 are portions of the display area DA, subpixels for displaying images should be disposed in the one or more optical areas OA1 and OA2. In addition, a light-transmitting structure should be disposed in the one or more optical areas OA1 and OA2 to transmit light to the one or more optoelectronic devices 11 and 12.

The one or more optoelectronic devices 11 and 12 are required to receive light and are located behind (or below, i.e., on the side opposite to the viewing side of) the display panel 110 to receive light that has passed through the display panel 110.

None of the one or more optoelectronic devices 11 and 12 is exposed through the front side (i.e., the viewing side) of the display panel 110. Thus, when a user views the front side of the display device 100, none of the one or more optoelectronic devices 11 and 12 is visible to the user.

For example, the first optoelectronic device 11 may be a camera, whereas the second optoelectronic device 12 may be a sensor such as a proximity sensor or a light sensor. For example, the sensor may be an infrared (IR) sensor that detects IR radiation.

In contrast, the first optoelectronic device 11 may be a sensor, whereas the second optoelectronic device 12 may be a camera.

Hereinafter, for the sake of brevity, the first optoelectronic device 11 will be illustrated as being a camera, whereas the second optoelectronic device 12 will be illustrated as being a sensor. The camera may be a camera lens or an image sensor.

When the first optoelectronic device 11 is a camera, the camera may be a front camera located behind (or below) the display panel 110 to capture images in a front-facing direction. Thus, the user may capture images using the camera not visible through the viewing side of the display panel 110 while viewing the viewing side.

Even in the case that the normal area NA and the one or more optical areas OA1 and OA2 of the display area DA are areas on which images may be displayed, the normal area NA is an area in which the light-transmitting structure is not required to be provided, while the one or more optical areas OA1 and OA2 are areas in which the light-transmitting structure is required to be provided.

Thus, the one or more optical areas OA1 and OA2 are required to have a predetermined level of transmittance or higher, while the normal area NA may entirely lack light transmittance or may have light transmittance lower than the predetermined level.

For example, at least one of resolution, a subpixel arrangement structure, a number of subpixels per unit area, an electrode structure, a line structure, an electrode arrangement structure, a line arrangement structure, and the like in the one or more optical areas OA1 and OA2 may be different from a corresponding one thereof in the normal area NA.

For example, the number of subpixels per unit area in the one or more optical areas OA1 and OA2 may be lower than the number of subpixels per unit area in the normal area NA. That is, the resolution of the one or more optical areas OA1 and OA2 may be lower than the resolution of the normal area NA. Here, the number of subpixels per unit area may be the unit of measurement of resolution and also be referred to as pixels per inch (PPI) indicating the number of pixels in a one inch square (1 $in^2$).

For example, the number of subpixels per unit area in the first optical area OA1 may be lower than the number of subpixels per unit area in the normal area NA. The number of subpixels per unit area in the second optical area OA2 may be equal to or greater than the number of subpixels per unit area in the first optical area OA1.

The first optical area OA1 may have any one of a variety of shapes such as a circle, an ellipse, a quadrangle, a hexagon, or an octagon. The second optical area OA2 may have any one of a variety of shapes such as a circle, an ellipse, a quadrangle, a hexagon, or an octagon. The first optical area OA1 and the second optical area OA2 may have the same shape or different shapes.

Referring to FIG. 1C, when the first optical area OA1 and the second optical area OA2 are in contact with each other, the entire optical area including the first optical area OA1 and the second optical area OA2 may have any one of a variety of shapes such as a circle, an ellipse, a quadrangle, a hexagon, or an octagon.

Hereinafter, for the sake of brevity, each of the first optical area OA1 and the second optical area OA2 will be illustrated as being circular.

In the display device 100 according to embodiments of the present disclosure, when the first optoelectronic device 11 covered below the display panel 110 so as not to be exposed externally is a camera, the display device 100 according to embodiments of the present disclosure may be a display to which under-display camera (UDC) technology is applied.

With this configuration, in the display device 100 according to embodiments of the present disclosure, the display panel 110 is not required to be provided with a notch or a camera hole through which a camera is exposed. Thus, the area size of the display area DA is not reduced.

Accordingly, since there is no need for the display panel 110 to be provided with a notch or a camera hole through which a camera is exposed, the size of the bezel area may be reduced, and a design limiting factor may also be removed, thereby increasing a degree of design freedom.

In the display device 100 according to embodiments of the present disclosure, even in the case that the one or more optoelectronic devices 11 and 12 are located to be hidden behind the display panel 110, one or more optoelectronic devices 11 and 12 are required to be able to normally receive light and normally perform the predetermined function.

In addition, in the display device 100 according to embodiments of the present disclosure, even in the case that the one or more optoelectronic devices 11 and 12 are located to be hidden behind the display panel 110 and overlap the display area DA, the one or more optical areas OA1 and OA2 of the display area DA overlapping the one or more optoelectronic devices 11 and 12 are required to be able to normally display images.

Figure 2:
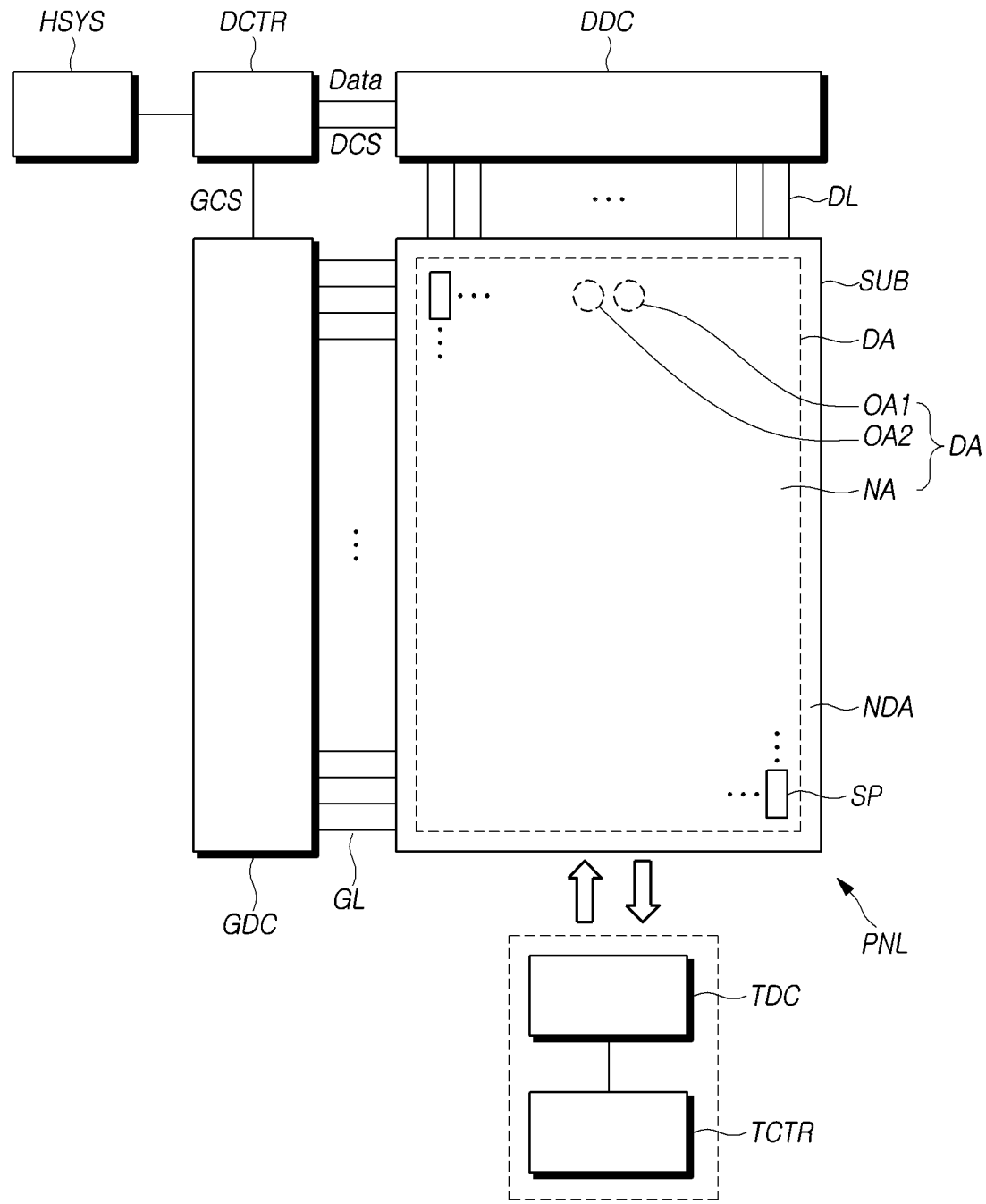
FIG. 2 is a diagram illustrating a system configuration of the display device according to embodiments of the present disclosure.

FIG. 2 is a diagram illustrating a system configuration of the display device 100 according to embodiments of the present disclosure.

Referring to FIG. 2, the display device 100 as components for displaying images may include a display panel PNL and a display driver circuit.

The display driver circuit is a circuit for driving the display panel PNL, and may include a data driver circuit DDC, a gate driver circuit GDC, a display controller DCTR, and the like.

The display panel PNL may include a display area DA on which images are displayed and a non-display area NDA on which no images are displayed. The non-display area NDA may be an area outside the display area DA, and may also be referred to as a bezel area. This bezel area is part of the non-display area for the entire display panel and is a different bezel area than the one that is in the central area of the display area. The entirety or a portion of the non-display area NDA may be an area visible through the front side of the display device 100 or be bent so as not to be visible through the front side of the display device 100.

The display panel PNL may include a substrate SUB and a plurality of subpixels SP disposed on the substrate SUB. In addition, the display panel PNL may further include various types of signal lines in order to drive the plurality of subpixels SP.

The display device 100 according to embodiments of the present disclosure may be a liquid crystal display (LCD) or a self-luminous display device in which the display panel PNL or the like emits light by itself. When the display device 100 according to embodiments of the present disclosure is a self-luminous display device, each of the plurality of subpixels SP may include a light-emitting device.

For example, the display device 100 according to embodiments of the present disclosure may be an organic light-emitting display device of which light-emitting devices are implemented as organic light-emitting diodes (OLEDs). In another example, the display device 100 according to embodiments of the present disclosure may be an inorganic light-emitting display device of which light-emitting devices are implemented as inorganic light-emitting diodes. In another example, the display device 100 according to embodiments of the present disclosure may be a quantum dot display device of which light-emitting devices are implemented as quantum dots (QDs) that are self-luminous semiconductor crystals.

The structure of each of the plurality of subpixels SP may vary depending on the type of the display device 100. For example, when the subpixels SP of the display device 100 are self-luminous display devices, each of the subpixels SP may include a self-luminous element, one or more transistors, and one or more capacitors.

For example, various types of signal lines may include a plurality of data lines DL through which data signals (also referred to as data voltages or image signals) are transmitted, gate lines GL through which gate signals (also referred to as scanning signals) are transmitted, and the like.

The plurality of data lines DL may intersect the plurality of gate lines GL. Each of the plurality of data lines DL may be disposed to extend in a first direction. Each of the plurality of gate lines GL may be disposed to extend in a second direction.

Here, the first direction may be a column direction, whereas the second direction may be a row direction. Alternatively, the first direction may be a row direction, whereas the second direction may be a column direction.

The data driver circuit DDC is a circuit for driving the plurality of data lines DL, and may output data signals to the plurality of data lines DL. The gate driver circuit GDC is a circuit for driving the plurality of gate lines GL, and may output gate signals to the plurality of gate lines GL.

The display controller DCTR is a device for controlling the data driver circuit DDC and the gate driver circuit GDC, and may control driving points in time regarding the plurality of data lines DL and driving points in time regarding the plurality of gate lines GL.

The display controller DCTR may transfer a data drive control signal DCS to the data driver circuit DDC to control the data driver circuit DDC and a gate drive control signal GCS to the gate driver circuit GDC to control the gate driver circuit GDC.

The display controller DCTR may receive input image data from a host system HSYS and transfer image data Data based on the input image data to the data driver circuit DDC.

The data driver circuit DDC may transfer data signals to the plurality of data lines DL in response to drive timing control of the display controller DCTR.

The data driver circuit DDC may receive the digital image data Data from the display controller DCTR, convert the received image data Data into analog data signals, and output the analog data signals to the plurality of data lines DL.

The gate driver circuit GDC may transfer gate signals to the plurality of gate lines GL in response to timing control of the display controller DCTR. The gate driver circuit GDC may receive a first gate voltage corresponding to a turn-on level voltage and a second gate voltage corresponding to a turn-off level voltage together with a variety of gate drive control signals GCS to generate gate signals and transfer the generated gate signals to the plurality of gate lines GL.

For example, the data driver circuit DDC may be connected to the display panel PNL by a tape-automated bonding (TAB) method, connected to a bonding pad of the display panel PNL by a chip-on-glass (COG) method or a chip-on-panel (COP) method, or implemented and connected to the display panel PNL by a chip-on-film (COF) method.

The gate driver circuit GDC may be connected to the display panel PNL by a TAB method, connected to a bonding pad of the display panel PNL by a COG method or a COP method, or connected to the display panel PNL by COF method. Alternatively, the gate driver circuit GDC may be formed on the non-display area NDA of the display panel PNL by a gate-in-panel (GIP) method. The gate driver circuit GDC may be disposed on or connected to a substrate. That is, when the gate driver circuit GDC is a GIP-type gate driver circuit, the gate driver circuit GDC may be disposed on the non-display area NDA. When the gate driver circuit GDC is formed by a COG-type gate driver circuit or a COF-type gate driver circuit, the gate driver circuit GDC may be connected to the substrate.

In addition, at least one driver circuit of the data driver circuit DDC and the gate driver circuit GDC may be disposed on the display area DA of the display panel PNL. For example, at least one driver circuit of the data driver circuit DDC and the gate driver circuit GDC may be disposed so as not to overlap the subpixels SP or may be disposed to overlap a portion of or the entirety of the subpixels SP.

The data driver circuit DDC may be connected to one side (e.g., the upper side or the lower side) of the display panel PNL. The data driver circuit DDC may be connected to both sides (e.g., both the upper side and the lower side) or connected to two or more sides of four sides of the display panel PNL, depending on the driving method, the design of the display panel, or the like.

The gate driver circuit GDC may be connected to one side (e.g., the left side or the right side) of the display panel PNL. The gate driver circuit GDC may be connected to both sides (e.g., both the left side and the right side) of the display panel PNL or connected to two or more sides of four sides of the display panel PNL, depending on the driving method, the design of the display panel, or the like.

The display controller DCTR may be implemented as a separate component from the data driver circuit DDC, or may be integrated with the data driver circuit DDC into an integrated circuit (IC).

The display controller DCTR may be a timing controller used in typical display technology, a control device including a timing controller and able to perform other control functions, a control device different from the timing controller, or a circuit in a control device. The display controller DCTR may be implemented as any one of a variety of circuits or electronic components such as an integrated circuit (IC), a field programmable gate array (FPGA), an application specific integrated circuit (ASIC), or a processor.

The display controller DCTR may be mounted on a printed circuit board (PCB), a flexible printed circuit (FPC), or the like and electrically connected to the data driver circuit DDC and the gate driver circuit GDC through the PCB, the FPC, or the like.

The display controller DCTR may transmit and receive signals to and from the data driver circuit DDC according to predetermined one or more interfaces. For example, examples of the interface may include a low voltage differential signaling (LVDS) interface, an embedded clock point-to-point (EP) interface, a serial peripheral interface (SPI), and the like.

The display device 100 according to embodiments of the present disclosure may include a touch sensor and a touch sensing circuit detecting the occurrence of a touch performed by a touch object, such as a finger or a pen, or determining a touch position by sensing the touch sensor.

The touch sensing circuit may include a touch driver circuit TDC generating and outputting touch sensing data by driving and sensing the touch sensor, a touch controller TCTR able to detect the occurrence of a touch and determining a touch position, and the like.

The touch sensor may include a plurality of touch electrodes. The touch sensor may further include a plurality of touch lines for electrically connecting the plurality of touch electrodes and the touch driver circuit TDC.

The touch sensor may be present outside the display panel PNL as a touch panel or present inside the display panel PNL. In the case that the touch sensor is present outside the display panel PNL as a touch panel, the touch sensor is referred to as an add-on touch sensor. In the case that the touch sensor is an add-on touch sensor, the touch panel and the display panel PNL may be fabricated separately and fitted to each other in an assembly process. The add-on touch panel may include a substrate for a touch panel, a plurality of touch electrodes on the substrate for a touch panel, and the like.

When the touch sensor is present inside the display panel PNL, the touch sensor may be formed on the substrate SUB together with signal lines and electrodes related to display driving during the fabrication process of the display panel PNL.

The touch driver circuit TDC may transfer a touch driving signal to at least one of the plurality of touch electrodes and generate touch sensing data by sensing at least one of the plurality of touch electrodes.

The touch sensing circuit may perform touch sensing by a self-capacitance sensing method or a mutual-capacitance sensing method.

When the touch sensing circuit performs touch sensing using the self-capacitance sensing method, the touch sensing circuit may perform touch sensing on the basis of the capacitance between each touch electrode and a touch object (e.g., a finger, a pen, etc.).

According to the self-capacitance sensing method, each of the plurality of touch electrodes may serve as both a drive touch electrode and a sensing touch electrode. The touch driver circuit TDC may drive the entirety of or a portion of the plurality of touch electrodes and sense the entirety or a portion of the plurality of touch electrodes.

When the touch sensing circuit performs touch sensing using the mutual-capacitance sensing method, the touch sensing circuit may perform touch sensing on the basis of capacitance between touch electrodes.

According to the mutual-capacitance sensing method, the plurality of touch electrodes are divided into driving touch electrodes and sensing touch electrodes. The touch driver circuit TDC may drive the driving touch electrodes and sense the sensing touch electrodes.

The touch driver circuit TDC and the touch controller TCTR in the touch sensing circuit may be implemented as separate devices or a single device. In addition, the touch driver circuit TDC and the data driver circuit DDC may be implemented as separate devices or a single device.

The display device 100 may include a power supply circuit or the like supplying various types of power to at least one of the display driver circuit and touch sensing circuit.

The display device 100 according to embodiments of the present disclosure may be a mobile device, such as a smart phone or a tablet, or a monitor, a TV, or the like, having a variety of sizes. However, the display device 100 is not limited thereto, and may be various types of display devices having a variety of sizes able to display information or images.

As described above, the display area DA in the display panel PNL may include the normal area NA and the one or more optical areas OA1 and OA2.

The normal area NA and the one or more optical areas OA1 and OA2 are areas on which images may be displayed. However, the normal area NA is an area in which the light-transmitting structure is not required to be formed, whereas the one or more optical areas OA1 and OA2 are areas in which the light-transmitting structure is required to be formed.

As described above, the display area DA in the display panel PNL may include the one or more optical areas OA1 and OA2 in addition to the normal area NA. For the sake of brevity, the display area DA will be taken to include both the first optical area OA1 and second optical area OA2 (see FIGS. 1C and 1D).

Figure 3:
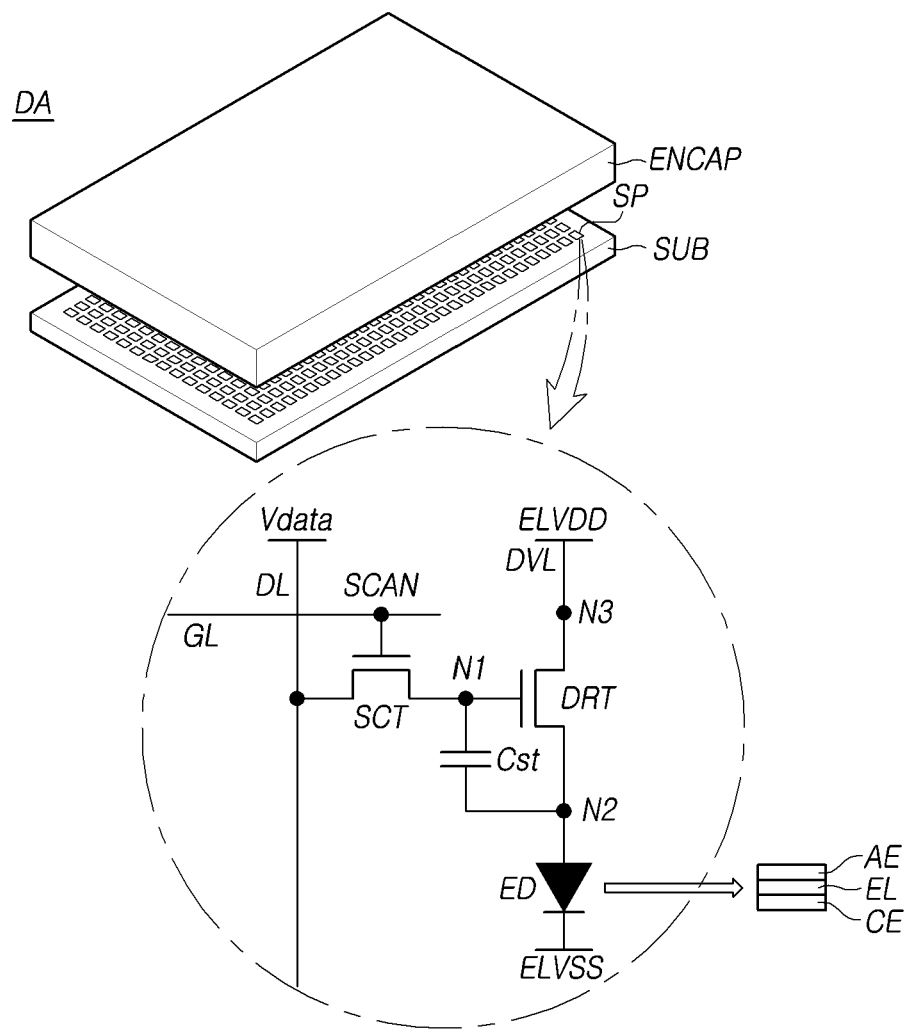
FIG. 3 is an equivalent circuit diagram of a subpixel in the display panel according to embodiments of the present disclosure.

FIG. 3 is an equivalent circuit diagram of each of the subpixels SP in the display panel PNL according to embodiments of the present disclosure.

Each of the subpixels SP disposed in the normal area NA, the first optical area OA1, and the second optical area OA2 included in the display area DA of the display panel PNL may include: an emitting device ED; a driving transistor DRT driving the emitting device ED; a scanning transistor SCT transferring a data voltage Vdata to a first node N1 of the driving transistor DRT; a storage capacitor Cst maintaining a predetermined voltage for a single-frame time.

The driving transistor DRT may include: the first node N1 to which a data voltage is applicable; a second node N2 electrically connected to the emitting device ED; and a third node N3 to which a driving voltage ELVDD from a driving voltage line DVL is applied. In the driving transistor DRT, the first node N1 may be a gate node, the second node N2 may be a source node or a drain node, and the third node N3 may be a drain node or a source node.

The emitting device ED may include an anode AE, an emitting layer EL, and a cathode CE. The anode AE may be a pixel electrode disposed in each of the subpixels SP and electrically connected to the second node N2 of the driving transistor DRT of each of the subpixels SP. The cathode CE may be a common electrode disposed in common to the plurality of subpixels SP, and a base voltage ELVSS may be applied to the cathode CE.

For example, the anode AE may be a pixel electrode, and the cathode CE may be a common electrode. In contrast, the anode AE may be a common electrode, whereas the cathode CE may be a pixel electrode. Hereinafter, for the sake of brevity, the anode AE will be supposed to be a pixel electrode, whereas the cathode CE will be supposed to be a common electrode.

For example, the emitting device ED is one that emits light and may be an OLED, an inorganic light-emitting diode, a quantum dot element, or the like. In this case, when the emitting device ED is an OLED, the emitting layer EL of the emitting device ED may include an organic emitting layer containing an organic material.

The scanning transistor SCT may be on/off controlled by a scanning signal SCAN, i.e., a gate signal, applied through a gate line GL. The scanning transistor SCT may be electrically connected to the first node N1 of the driving transistor DRT and a data line DL.

The storage capacitor Cst may be electrically connected to the first node N1 and the second node N2 of the driving transistor DRT.

As illustrated in FIG. 3, each of the subpixels SP may have a 2-transistor 1-capacitor (2T1C) structure including two transistors DRT and SCT and a single capacitor Cst. In some cases, each of the subpixels SP may further include one or more transistors or one or more capacitors.

The storage capacitor Cst may be an external capacitor intentionally designed to be provided externally of the driving transistor DRT, rather than a parasitic capacitor (e.g., Cgs or Cgd), i.e., an internal capacitor that may be present between the first node N1 and the second node N2 of the driving transistor DRT.

Each of the driving transistor DRT and the scanning transistor SCT may be an N-type transistor or a P-type transistor.

Since circuit elements (in particular, the emitting device ED) in each of the subpixels SP is vulnerable to external moisture, oxygen, or the like, an encapsulation layer ENCAP may be disposed on the display panel PNL to prevent external moisture or oxygen from penetrating into the circuit elements (in particular, the emitting device ED). The encapsulation layer ENCAP may be disposed to cover the emitting devices ED.

In addition, as a method for increasing the transmittance of at least one of the first optical area OA1 and the second optical area OA2, a differential pixel density design method as described above may be used. According to the differential pixel density design method, the display panel PNL may be designed such that the number of subpixels per unit area of at least one of the first optical area OA1 and the second optical area OA2 is greater than the number of subpixels per unit area of the normal area NA.

However, in some cases, differently, as another method for increasing the transmittance of at least one of the first optical area OA1 and the second optical area OA2, a pixel size differential design method may be used. According to the pixel size differential design method, the display panel PNL may be designed such that the number of subpixels per unit area of at least one of the first optical area OA1 and the second optical area OA2 is the same as or similar to the number of subpixels per unit area of the normal area NA and the size of each of the subpixels SP (i.e., the size of an emitting area) is smaller than the size (i.e., the size of the emitting area) of each of the subpixels SP disposed in the normal area NA.

Hereinafter, for the sake of brevity, it will be described by assuming that the differential pixel density design method of the two methods (i.e., the differential pixel density design method and the pixel size differential design method) for increasing the transmittance of at least one of the first optical area OA1 and the second optical area OA2 is used.

Figure 4:
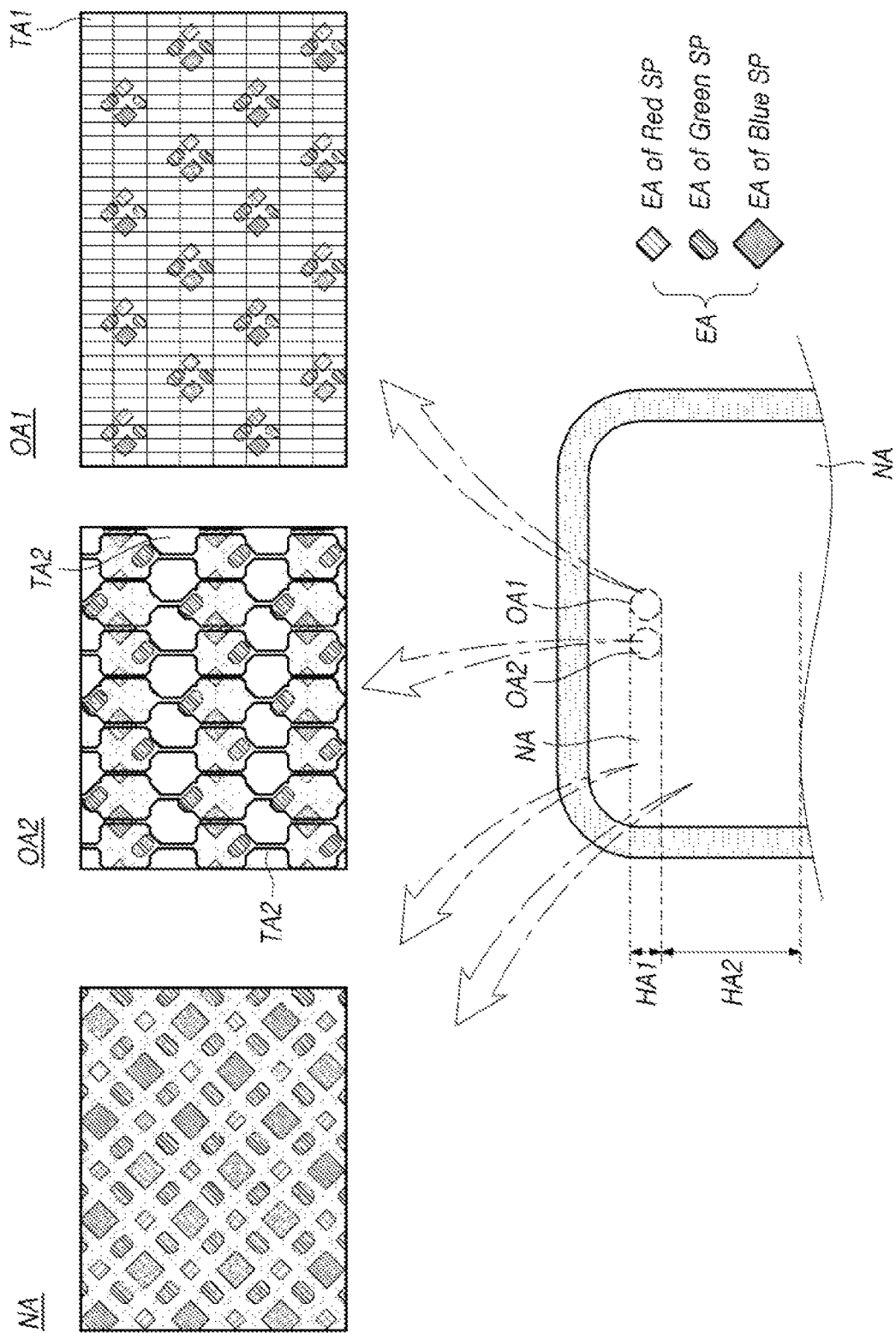
FIG. 4 is a layout diagram of subpixels in three areas in the display area of the display panel according to embodiments of the present disclosure.

FIG. 4 is a layout diagram of subpixels in the three areas NA, OA1, and OA2 in the display area DA of the display panel PNL according to embodiments of the present disclosure.

Referring to FIG. 4, a plurality of subpixels SP may be disposed in each of the normal area NA, the first optical area OA1, and the second optical area OA2 of the display area DA.

For example, the plurality of subpixels SP may include red subpixels Red SP emitting red light, green subpixels Green SP emitting green light, and blue subpixels Blue SP emitting blue light.

Accordingly, each of the normal area NA, the first optical area OA1, and the second optical area OA2 may include emitting areas EA of the red subpixels Red SP, emitting areas EA of the green subpixels Green SP, and emitting areas EA of the blue subpixels Blue SP.

Referring to FIG. 4, the normal area NA may include emitting areas EA without including the light-transmitting structure.

However, each of the first optical area OA1 and the second optical area OA2 is required to include not only the emitting areas EA but also the light-transmitting structure.

Thus, the first optical area OA1 may include the emitting areas EA and first transmission areas TA1, whereas the second optical area OA2 may include the emitting areas EA and second transmission areas TA2.

The emitting areas EA and the transmission areas TA1 and TA2 may be distinguished depending on whether or not light transmission is possible. The transmission areas TA1 and TA2 may be areas allowing light to pass therethrough.

In addition, the emitting areas EA and the transmission areas TA1 and TA2 may be distinguished depending on whether or not a specific metal layer CE is formed. For example, the emitting areas EA may be provided with the cathode CE, whereas none of the transmission areas TA1 and TA2 may be provided with the cathode CE. The emitting areas EA may be provided with a light shield layer, whereas none of the transmission areas TA1 and TA2 may be provided with a light shield layer.

Since the first optical area OA1 includes the first transmission areas TA1 and the second optical area OA2 includes the second transmission areas TA2, both the first optical area OA1 and the second optical area OA2 are areas allowing light to pass therethrough.

The transmittance (or the degree of transmission) of the first optical area OA1 and the transmittance (or the degree of transmission) of the second optical area OA2 may be the same.

In this case, the shape or size of the first transmission areas TA1 of the first optical area OA1 may be the same as the shape or size of the second transmission areas TA2 of the second optical area OA2. Even in the case that the shape or size of the first transmission areas TA1 of the first optical area OA1 is different from the shape or size of the second transmission areas TA2 of the second optical area OA2, the size ratio of the first transmission areas TA1 with respect to the first optical area OA1 may be the same as the size ratio of the second transmission areas TA2 with respect to the second optical area OA2.

Alternatively, the transmittance (or the degree of transmission) of the first optical area OA1 is different from the transmittance (or the degree of transmission) of the second optical area OA2.

In this case, the shape or size of the first transmission areas TA1 of the first optical area OA1 may be different from the shape or size of the second transmission areas TA2 of the second optical area OA2. Even in the case that the shape or size of the first transmission areas TA1 of the first optical area OA1 is the same as the shape or size of the second transmission areas TA2 of the second optical area OA2, the size ratio of the first transmission areas TA1 with respect to the first optical area OA1 may be different from the size ratio of the second transmission areas TA2 with respect to the second optical area OA2.

For example, when the first optoelectronic device 11 overlapping the first optical area OA1 is a camera and the second optoelectronic device 12 overlapping the second optical area OA2 is a sensor, the camera may need a greater amount of light than the sensor.

Thus, the transmittance (or the degree of transmission) of the first optical area OA1 may be higher than the transmittance (or the degree of transmission) of the second optical area OA2.

In this case, the size of the first transmission areas TA1 in the first optical area OA1 may be greater than the size of the second transmission areas TA2 in the second optical area OA2. Even in the case that the size of the first transmission areas TA1 in the first optical area OA1 is the same as the size of the second transmission areas TA2 in the second optical area OA2, the size ratio of the first transmission areas TA1 with respect to the first optical area OA1 may be greater than the size ratio of the second transmission areas TA2 with respect to the second optical area OA2.

Hereinafter, for the sake of brevity, a case in which the transmittance (or the degree of transmission) of the first optical area OA1 is higher than the transmittance (or the degree of transmission) of the second optical area OA2 will be described as an example.

In addition, as illustrated in FIG. 4, in embodiments of the present disclosure, the transmission areas TA1 and TA2 may also be referred to as transparent areas, and the transmittance may also be referred to as transparency.

In addition, as illustrated in FIG. 4, in embodiments of the present disclosure, a case in which the first optical area OA1 and the second optical area OA2 are located in the top portion of the display area DA of the display panel PNL and disposed side by side will be described.

Referring to FIG. 4, a horizontal display area in which the first optical area OA1 and the second optical area OA2 are disposed will be referred to as a first horizontal display area HA1, and a horizontal display area in which none of the first optical area OA1 and the second optical area OA2 are disposed will be referred to as a second horizontal display area HA2.

Referring to FIG. 4, the first horizontal display area HA1 may include a portion of the normal area NA, the first optical area OA1, and the second optical area OA2. The second horizontal display area HA2 may only include a portion of the normal area NA.

Figure 5A:
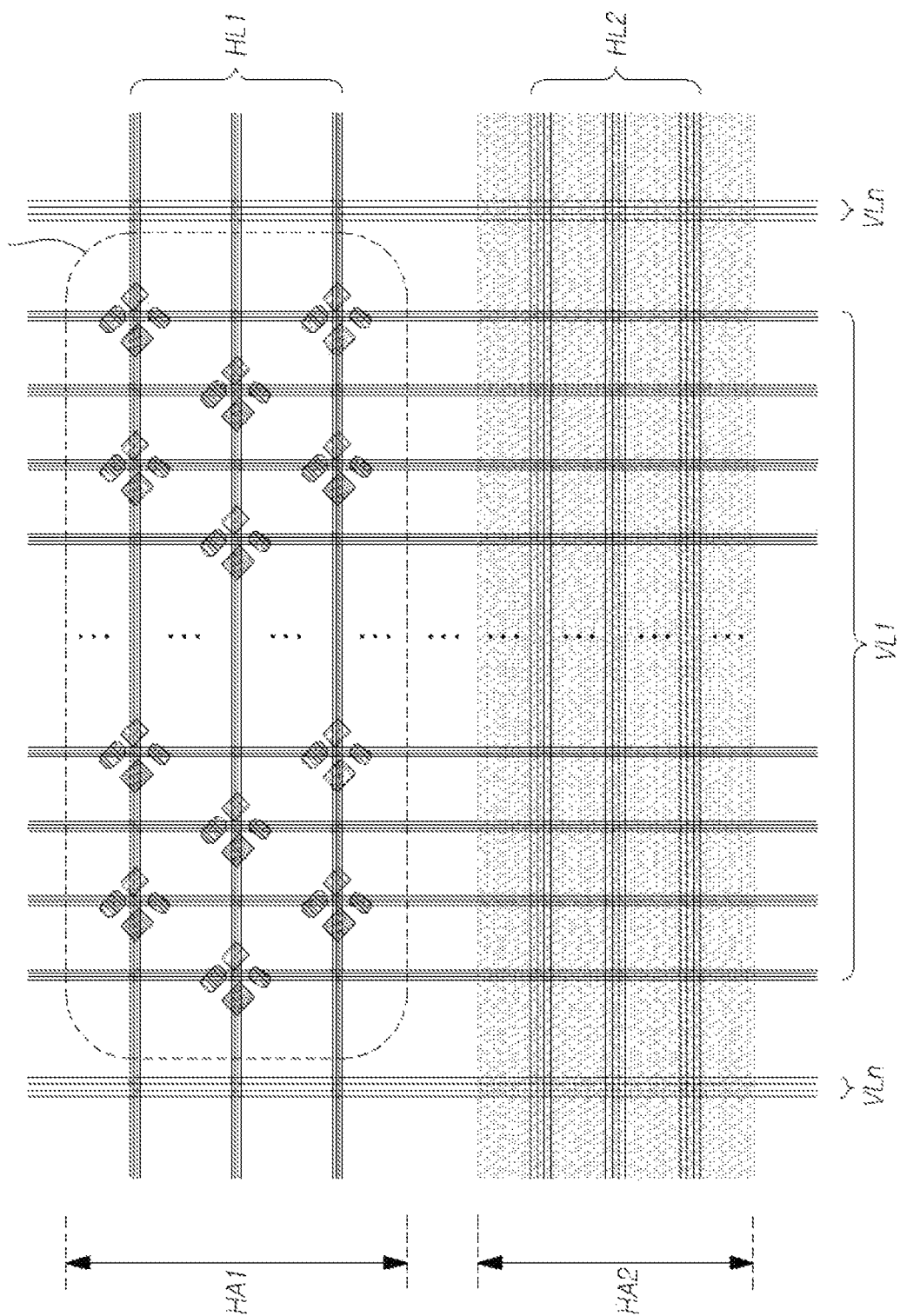
FIG. 5A is a layout diagram of signal lines in the first optical area and the normal area in the display panel according to embodiments of the present disclosure.
Figure 5B:
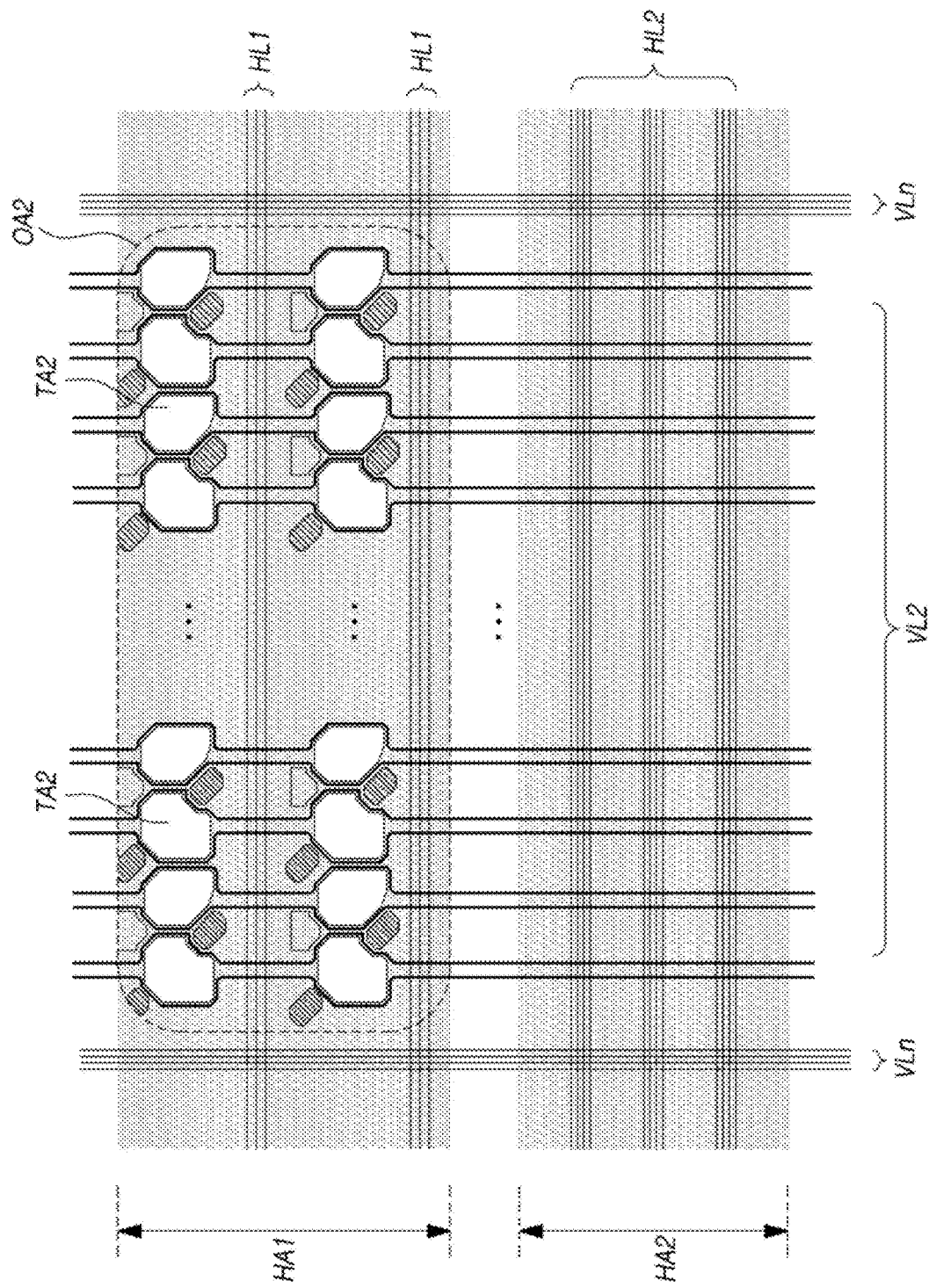
FIG. 5B is a layout diagram of signal lines in the second optical area and the normal area in the display panel according to embodiments of the present disclosure.

FIG. 5A is a layout diagram of signal lines in the first optical area OA1 and the normal area NA in the display panel PNL according to embodiments of the present disclosure, while FIG. 5B is a layout diagram of signal lines in the second optical area OA2 and the normal area NA in the display panel PNL according to embodiments of the present disclosure.

The first horizontal display area HA1 illustrated in FIGS. 5A and 5B is a portion of the first horizontal display area HA1 in the display panel PNL, whereas the second horizontal display area HA2 is a portion of the second horizontal display area HA2 in display panel PNL.

The first optical area OA1 illustrated in FIG. 5A is a portion of the first optical area OA1 in the display panel PNL, whereas the second optical area OA2 illustrated in FIG. 5B is a portion of the second optical area OA2 in the display panel PNL.

Referring to FIGS. 5A and 5B, the first horizontal display area HA1 may include a portion of the normal area NA, the first optical area OA1, and the second optical area OA2. The second horizontal display area HA2 may include a portion of the normal area NA.

Various types of horizontal lines HL1 and HL2 and various types of vertical lines VLn, VL1, and VL2 may be disposed in the display panel PNL.

In embodiments of the present disclosure, the horizontal direction and the vertical direction refer to two intersecting directions. The horizontal direction and the vertical direction may vary depending on the viewing direction. For example, the horizontal direction indicates a direction in which a single gate line GL is disposed and extends, wherein the vertical direction indicates a direction in which a single data line DL is disposed and extends. In this manner, the horizontal direction and the vertical direction will be taken as an example.

Referring to FIGS. 5A and 5B, the horizontal lines disposed in the display panel PNL may include first horizontal lines HL1 disposed in the first horizontal display area HA1 and the second horizontal lines HL2 disposed in the second horizontal display area HA2.

The horizontal lines disposed in the display panel PNL may be gate lines GL. That is, the first horizontal lines HL1 and the second horizontal lines HL2 may be gate lines GL. The gate lines GL may include various types of gate lines depending on the structure of the subpixels SP.

Referring to FIGS. 5A and 5B, the vertical lines disposed in the display panel PNL may include normal vertical lines VLn only disposed in the normal area NA, first vertical lines VL1 extending through both the first optical area OA1 and the normal area NA, and second vertical lines VL2 extending through both the second optical area OA2 and the normal area NA.

The vertical lines disposed in the display panel PNL may include data lines DL, driving voltage lines DVL, or the like, and may also include reference voltage lines, initialization voltage lines, or the like. That is, the normal vertical lines VLn, the first vertical lines VL1, and the second vertical lines VL2 may include the data lines DL, the driving voltage lines DVL, or the like, and may also include the reference voltage lines, the initialization voltage lines, or the like.

In embodiments of the present disclosure, the term "horizontal" in the second horizontal line HL2 only indicates that a signal is transmitted from the left to the right (or from the right to the left), but does not indicate that the second horizontal line HL2 only extends linearly in a horizontal direction. That is, the second horizontal line HL2 is illustrated in the form of a straight line in FIGS. 5A and 5B, but may include bent or curved portions. In the same manner, the first horizontal line HL1 may include bent or curved portions.

In embodiments of the present disclosure, the term "vertical" in the normal vertical line VLn only indicates that a signal is transmitted from the upper side to the lower side (or from the lower side to the upper side), but does not indicate that the normal vertical line VLn only extends linearly in a vertical direction. That is, the normal vertical line VLn is illustrated in the form of a straight line in FIGS. 5A and 5B, but may include bent or curved portions. In the same manner, the first vertical line VL1 and the second vertical line VL2 may include bent or curved portions.

Referring to FIG. 5A, the first optical area OA1 included in the first horizontal display area HA1 may include the emitting areas EA and the first transmission areas TA1. In the first optical area OA1, an outer area of the first transmission areas TA1 may include the emitting areas EA.

Referring to FIG. 5A, in order to improve the transmittance of the first optical area OA1, the first horizontal lines HL1 passing through the first optical area OA1 may bypass the first transmission areas TA1 in the first optical area OA1.

Thus, each of the first horizontal lines HL1 passing through the first optical area OA1 may include a curved section or a bent section bypassing the boundaries of the first transmission areas TA1.

Thus, the shape, the length, or the like of the first horizontal line HL1 disposed in the first horizontal display area HA1 may be different from the shape, the length, or the like of the second horizontal line HL2 disposed in the second horizontal display area HA2. That is, the shape, the length, or the like of the first horizontal line HL1 passing through the first optical area OA1 may be different from the shape, the length, or the like of the second horizontal line HL2 not passing through the first optical area OA1.

In addition, in order to improve the transmittance of the first optical area OA1, the first vertical lines VL1 passing through the first optical area OA1 may bypass the first transmission areas TA1 in the first optical area OA1.

Thus, each of the first vertical lines VL1 passing through the first optical area OA1 may include a curved section, a bent section, or the like bypassing the boundary of each of the first transmission areas TA1.

Accordingly, the shape, the length, or the like of the first vertical line VL1 passing through the first optical area OA1 may be different from the shape, the length, or the like of the normal vertical line VLn disposed in the normal area NA without passing through the first optical area OA1.

Referring to FIG. 5A, the first transmission areas TA1 included in the first optical area OA1 in the first horizontal display area HA1 may be disposed in oblique directions (or in a staggered arrangement).

Referring to FIG. 5A, in the first optical area OA1 in the first horizontal display area HA1, emitting areas EA may be disposed between two first transmission areas TA1 adjacent to each other in the transverse direction. In the first optical area OA1 in the first horizontal display area HA1, emitting areas EA may be disposed between two first transmission areas TA1 adjacent to each other in the top-bottom direction.

Referring to FIG. 5A, each of the first horizontal lines HL1 disposed in the first horizontal display area HA1, i.e., passing through the first optical area OA1, may include at least one of curved sections or bent sections bypassing the boundaries of the first transmission areas TA1.

Referring to FIG. 5B, the second optical area OA2 included in the first horizontal display area HA1 may include the emitting areas EA and the second transmission areas TA2. In the second optical area OA2, outer areas of the second transmission areas TA2 may include the emitting areas EA.

Positions and arrangement states of the emitting areas EA and the second transmission areas TA2 in the second optical area OA2 may be the same as positions and arrangement states of the emitting areas EA and the first transmission areas TA1 in the first optical area OA1 illustrated in FIG. 5A.

Alternatively, as illustrated in FIG. 5B, the positions and arrangement states of the emitting areas EA and the second transmission areas TA2 in the second optical area OA2 may be different from the positions and arrangement states of the emitting areas EA and the first transmission areas TA1 in the first optical area OA1 illustrated in FIG. 5A.

For example, referring to FIG. 5B, in the second optical area OA2, the second transmission areas TA2 may be disposed in the horizontal direction (or the transverse direction). Between two second transmission areas TA2 adjacent in the horizontal direction (or the transverse direction), none of the emitting areas EA may be disposed. In addition, the emitting areas EA in the second optical area OA2 may be disposed between the second transmission areas TA2 adjacent in the vertical direction (or the top-bottom direction). That is, the emitting areas EA may be disposed between two rows of second transmission areas.

When the first horizontal lines HL1 pass through the first optical area OA1 and a portion of the normal area NA adjacent to the first optical area OA1 in the first horizontal display area HA1, the first horizontal lines HL1 may extend with the same shape as illustrated in FIG. 5A.

Alternatively, as illustrated in FIG. 5B, when the first horizontal lines HL1 pass through the second optical area OA2 and the portion of the normal area NA adjacent to the second optical area OA2 in the first horizontal display area HA1, the first horizontal lines HL1 may extend with a shape different from the shape illustrated in FIG. 5A.

This is because the positions and arrangement states of the emitting areas EA and the second transmission areas TA2 in the second optical area OA2 illustrated in FIG. 5B are different from the positions and arrangement states of the emitting areas EA and the first transmission areas TA1 in the first optical area OA1 illustrated in FIG. 5A.

Referring to FIG. 5B, when the first horizontal lines HL1 pass through the second optical areas OA2 and the portion of the normal area NA adjacent to the second optical area OA2 in the first horizontal display area HA1, the first horizontal lines HL1 may extend in the form of straight lines between the second transmission areas TA2 adjacent in the top-bottom direction without a curved section or a bent section.

In other words, a single first horizontal line HL1 may have a curved section or a bent section in the first optical area OA1, but may not have a curved section or a bent section in the second optical area OA2.

In order to improve the transmittance of the second optical area OA2, the second vertical lines VL2 passing through the second optical area OA2 may extend to bypass the second transmission areas TA2 in the second optical area OA2.

Thus, each of the second vertical lines VL2 passing through the second optical area OA2 may include a curved section or a bent section bypassing the boundary of each of the second transmission areas TA2.

Accordingly, the shape, the length, or the like of the second vertical line VL2 passing through the second optical area OA2 may be different from the shape, the length, or the like of the normal vertical line VLn disposed in the normal area NA without passing through the second optical area OA2.

As illustrated in FIG. 5A, the first horizontal line HL1 passing through the first optical area OA1 may have curved sections or bent sections bypassing the boundaries of the first transmission areas TA1.

Thus, the length of the first horizontal line HL1 passing through the first optical area OA1 and the second optical area OA2 may be slightly longer than the length of the second horizontal line HL2 disposed in the normal area NA without passing through the first optical area OA1 or the second optical area OA2.

Accordingly, resistance of the first horizontal line HL1 (hereinafter, also referred to as first resistance) passing through the first optical area OA1 and the second optical area OA2 may be slightly greater than resistance of the second horizontal line HL2 (hereinafter, also referred to as second resistance) only disposed in the normal area NA without passing through the first optical area OA1 or the second optical area OA2.

Referring to FIGS. 5A and 5B, since the first optical area OA1, at least a portion of which overlaps the first optoelectronic device 11, includes a plurality of first transmission areas TA1 and the second optical area OA2, at least a portion of which overlaps the second optoelectronic device 12, includes a plurality of second transmission areas TA2 depending on the light-transmitting structure, the number of subpixels per unit area of each of the first optical area OA1 and the second optical area OA2 may be lower than the number of subpixels per unit area of the normal area NA.

The number of subpixels, among the subpixels SP, to which the first horizontal line HL1 passing through the first optical area OA1 and the second optical area OA2 is connected, may be different from the number of subpixels, among the subpixels SP, to which the second horizontal line HL2 only disposed in the normal area NA without passing through the first optical area OA1 or the second optical area OA2 is connected.

The number (i.e., a first number) of subpixels, among the subpixels SP, to which the first horizontal line HL1 passing through the first optical area OA1 and the second optical area OA2 is connected, may be lower than the number (i.e., a second number) of subpixels, among the subpixels SP, to which the second horizontal line HL2 only disposed in the normal area NA without passing through the first optical area OA1 or the second optical area OA2 is connected.

The difference between the first number and the second number may vary depending on the difference between the resolution of each of the first optical area OA1 and the second optical area OA2 and the resolution of the normal area NA. For example, with increases in the difference between the resolution of each of the first optical area OA1 and the second optical area OA2 and the resolution of the normal area NA, the difference between the first number and the second number may increase.

As described above, since the number (i.e., the first number) of subpixels, among the subpixels SP, to which the first horizontal line HL1 passing through the first optical area OA1 and the second optical area OA2 is connected, is lower than the number (i.e., the second number) of subpixels, among the subpixels SP, to which the second horizontal line HL2 only disposed in the normal area NA without passing through the first optical area OA1 or the second optical area OA2 is connected, the area of the first horizontal line HL1 overlapping the surrounding electrodes or lines may be smaller than the area of the second horizontal line HL2 overlapping the surrounding electrodes or lines.

Thus, parasitic capacitance (hereinafter, referred to as first capacitance) generated between the first horizontal line HL1 and the surrounding electrodes or lines may be lower than parasitic capacitance (hereinafter, referred to as second capacitance) generated between the second horizontal line HL2 and the surrounding electrodes or lines.

In consideration of the relative magnitude between the first resistance and the second resistance (first resistance≥second resistance) and the relative magnitude between the first capacitance and the second capacitance (first capacitance«second capacitance), a resistance-capacitance (RC) value (hereinafter, referred to as a first RC value) of the first horizontal line HL1 passing through the first optical area OA1 and the second optical area OA2 may be significantly lower than an RC value (hereinafter, referred to as a second RC value) of the second horizontal line HL2 only disposed in the normal area NA without passing through the first optical area OA1 or the second optical area OA2 (first RC value«second RC value).

Due to the difference (hereinafter, referred to as RC load difference) between the first RC value of the first horizontal line HL1 and the second RC value of the second horizontal line HL2, signal transmission characteristics through the first horizontal line HL1 may be different from signal transmission characteristics through the second horizontal line HL2.

Figure 6:
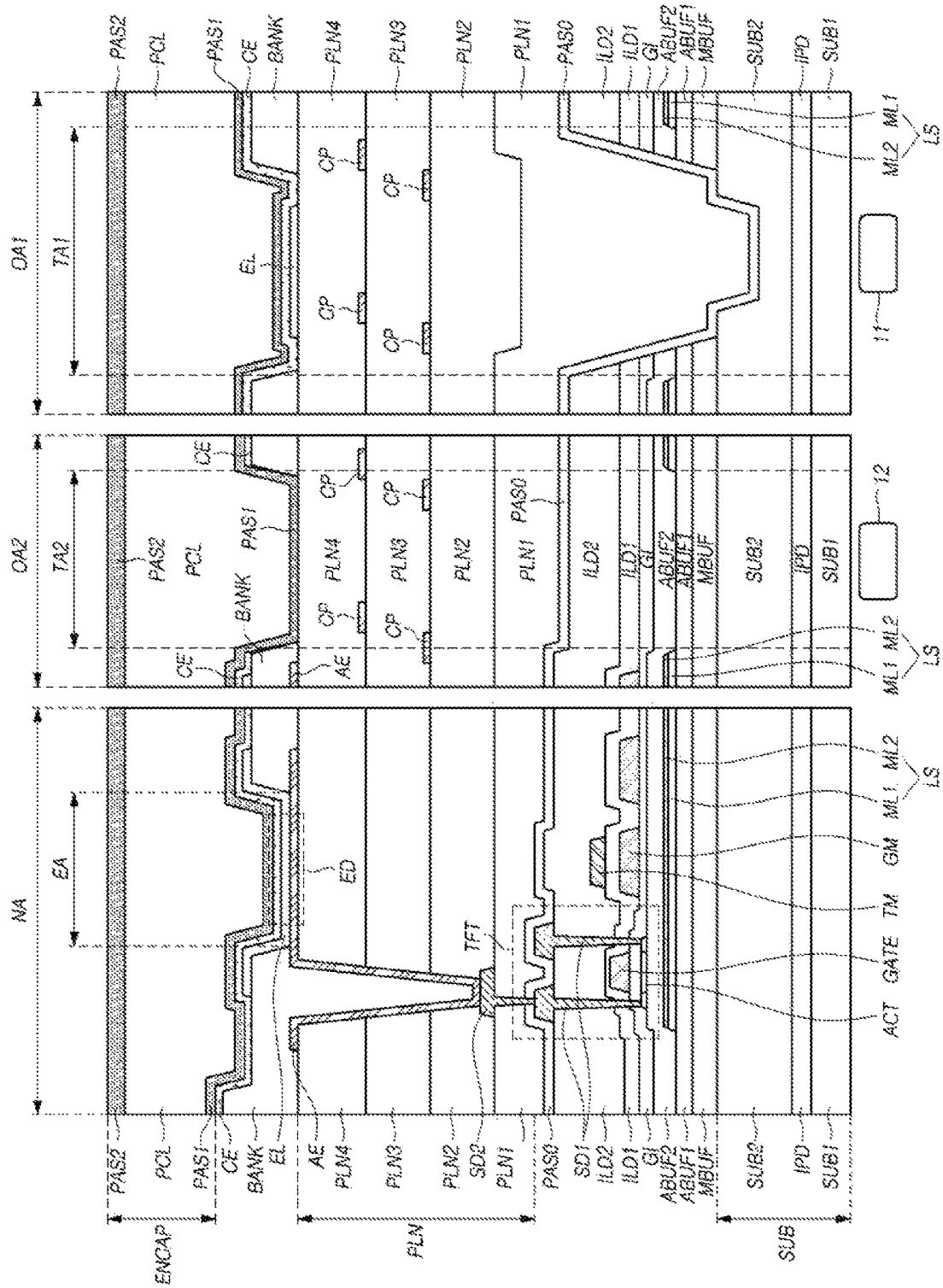
FIGS. 6 and 7 are cross-sectional diagrams of the normal area, the first optical area, and the second optical area included in the display area of the display panel according to various embodiments of the present disclosure.
Figure 7:
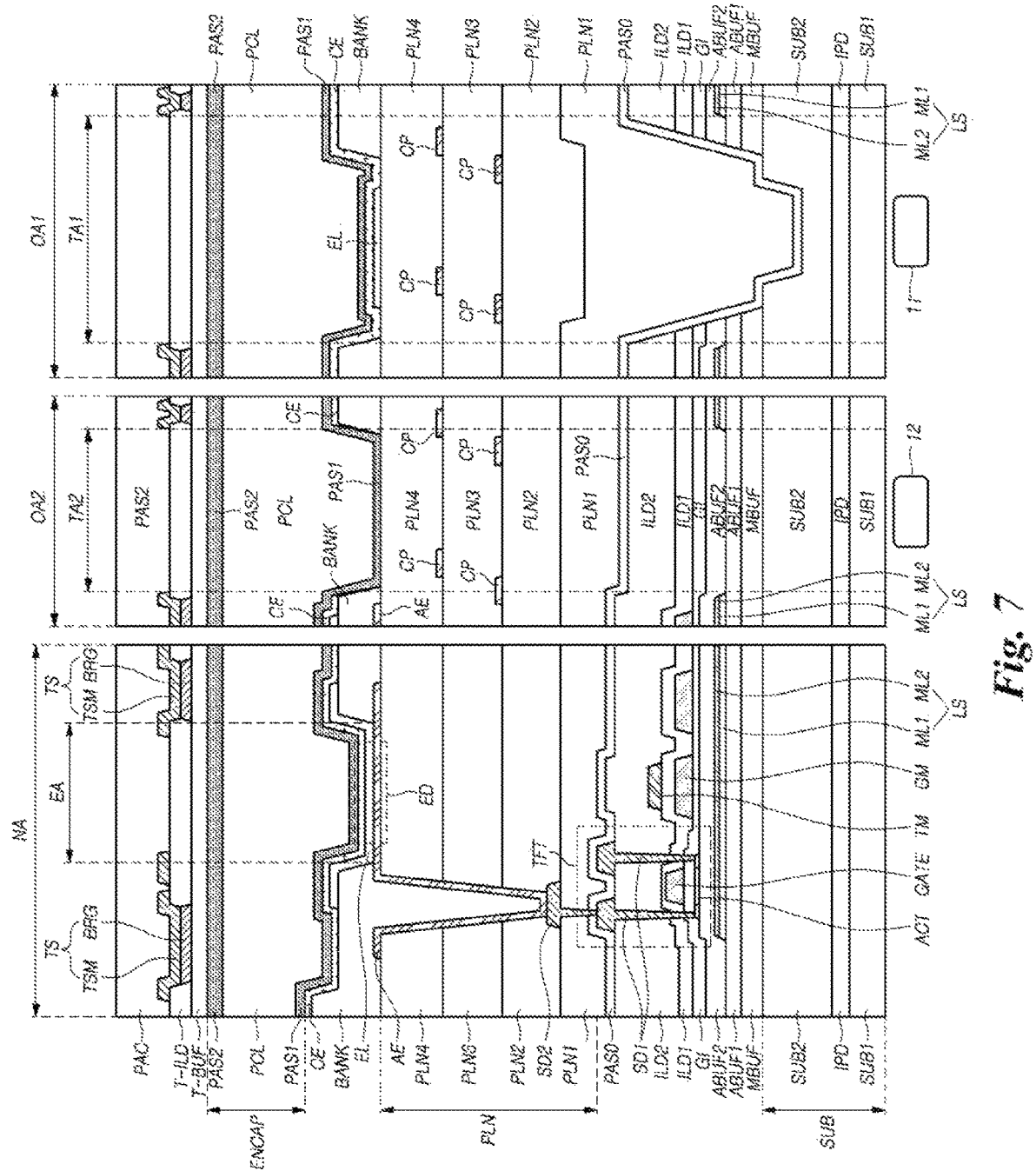

FIGS. 6 and 7 are cross-sectional diagrams of the normal area NA, the first optical area OA1, and the second optical area OA2 included in the display area DA of the display panel PNL according to embodiments of the present disclosure.

FIG. 6 illustrates cross-sections of the display panel PNL in a case in which touch sensors are present outside the display panel PNL in the form of a touch panel, while FIG. 7 illustrates cross-sectional diagrams of the display panel PNL in a case in which touch sensors TS are present inside the display panel PNL.

Each of FIGS. 6 and 7 illustrates cross-sections of the normal area NA, the first optical area OA1, and the second optical area OA2 included in the display area DA.

First, a layered structure of the normal area NA will be described with reference to FIGS. 6 and 7. An emitting area EA included in each of the first optical area OA1 and the second optical area OA2 may have the same layered structure as an emitting area EA included in the normal area NA.

Referring to FIGS. 6 and 7, a substrate SUB may include a first substrate SUB1, an interlayer insulating film IPD, and a second substrate SUB2. The interlayer insulating film IPD may be located between the first substrate SUB1 and the second substrate SUB2. Since the substrate SUB is comprised of the first substrate SUB1, the interlayer insulating film IPD, and the second substrate SUB2, it is possible to prevent moisture penetration. For example, the first substrate SUB1 and the second substrate SUB2 may be polyimide (PI) substrates. The first substrate SUB1 may be referred to as a first PI substrate, while the second substrate SUB2 may be referred to as a second PI substrate.

Referring to FIGS. 6 and 7, a variety of patterns ACT, SD1, and GATE for forming a transistor such as a transistor TFT, a variety of insulating films MBUF, ABUF1, ABUF2, GI, ILD1, ILD2, and PAS0, and a variety of metal patterns TM, GM, ML1, and ML2 may be disposed on the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. Here, the first metal layer ML1 and the second metal layer ML2 may be included in a light shield layer LS providing a light shield.

A second active buffer layer ABUF2 may be disposed on the first metal layer ML1 and the second metal layer ML2. An active layer ACT of the transistor TFT may be disposed on the second active buffer layer ABUF2. The term active layer ACT refers to a semiconductor active layer and it can be comprised of one or more semiconductor layers.

A gate insulating film GI may be disposed while covering the active layer ACT.

A gate electrode GATE of the transistor TFT may be disposed on the gate insulating film GI. A gate material layer GM may be disposed on the gate insulating film GI together with the gate electrode GATE of the transistor TFT, at a position different from a position at which the transistor TFT is formed.

A first interlayer insulating film ILD1 may be disposed to cover the gate electrode GATE and the gate material layer GM. A metal pattern TM may be disposed on the first interlayer insulating film ILD1. The metal pattern TM may be located at a position different from a position at which the transistor TFT is formed. A second interlayer insulating film ILD2 may be disposed to cover the metal pattern TM on the first interlayer insulating film ILD1.

Two first source-drain electrode patterns SD1 may be disposed on the second interlayer insulating film ILD2. One of the two first source-drain electrode patterns SD1 is a source node of the transistor TFT, and the other of the two first source-drain electrode patterns SD1 is a drain node of the transistor TFT. The term source-drain electrode is used herein in the broadest sense to include either a source electrode, a drain electrode or both a source and a drain electrode. As is known to those of skill in the art, a particular electrode contacting an active area of a transistor can be either source or a drain electrode and the name by which the electrode is called might change based on the electrical connection and the voltages present on various nodes of the transistor at any particular time. Thus, it is common in the art to refer to such electrodes as source-drain electrodes.

The two first source-drain electrode patterns SD1 may be electrically connected to one side and the other side of the active layer ACT through contact holes in the second interlayer insulating film ILD2, the first interlayer insulating film ILD1, and the gate insulating film GI.

A portion of the active layer ACT overlapping the gate electrode GATE is a channel area. One of the two first source-drain electrode patterns SD1 may be connected to one side of the channel area in the active layer ACT, and the other of the two first source-drain electrode patterns SD1 may be connected to the other side of the channel area in the active layer ACT.

A passivation layer PAS0 is disposed to cover the two first source-drain electrode patterns SD1. Planarization layers PLN may be disposed on the passivation layer PAS0. The planarization layer PLN may include first to fourth planarization layers PLN1 to PLN4.

The first planarization layer PLN1 may be disposed on the passivation layer PAS0.

A second source-drain electrode pattern SD2 may be disposed on the first planarization layer PLN1. The second source-drain electrode pattern SD2 may be connected to one first source-drain electrode pattern (corresponding to the second node N2 of the transistor TFT in the subpixel SP illustrated in FIG. 3) of the two first source-drain electrode patterns SD1 through a contact hole in the first planarization layer PLN1.

A second planarization layer PLN2 may be disposed to cover the second source-drain electrode pattern SD2.

A third planarization layer PLN3 and a fourth planarization layer PLN4 may be sequentially disposed on the second planarization layer PLN2.

Emitting devices ED may be disposed on the fourth planarization layer PLN4.

Reviewing the layered structure of each of the emitting devices ED, an anode AE may be disposed on the second planarization layer PLN2. The anode AE may be electrically connected to the second source-drain electrode pattern SD2 through a contact hole in the second to fourth planarization layers PLN2 to PLN4.

A bank BANK may be disposed to cover a portion of the anode AE. A portion of the bank BANK corresponding to the emitting area EA of the subpixel SP may be opened.

A portion of the anode AE may be exposed through an open area (i.e., the opened portion) of the bank BANK. The emitting layer EL may be located on a side surface of the bank BANK and in the open area (i.e., the opened portion) of the bank BANK. The entirety or a portion of the emitting layer EL may be located between adjacent banks BANK.

In the open area of the bank BANK, the emitting layer EL may be in contact with the anode AE. A cathode CE may be disposed on the emitting layer EL.

The anode AE, the emitting layer EL, and the cathode CE may constitute an emitting device ED. The emitting layer EL may include an organic film.

An encapsulation layer ENCAP may be disposed on the emitting device ED.

The encapsulation layer ENCAP may have a single-layer structure or a multilayer structure. For example, as illustrated in FIGS. 6 and 7, the encapsulation layer ENCAP may include a first encapsulation layer PAS1, a second encapsulation layer PCL, and a third encapsulation layer PAS2.

For example, the first encapsulation layer PAS1 and the third encapsulation layer PAS2 may be inorganic films, while the second encapsulation layer PCL may be an organic film. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode CE and most adjacent to the emitting device ED. The first encapsulation layer PAS1 may be formed of an inorganic insulating material capable of low-temperature deposition. For example, the inorganic insulating material of the first encapsulation layer PAS1 may be silicon nitride ($SiN_x$), silicon oxide ($SiO_x$), silicon oxynitride (SiON), aluminum oxide, or the like. Since the first encapsulation layer PAS1 is deposited in a low-temperature atmosphere, the first encapsulation layer PAS1 may prevent the emitting layer EL including an organic material vulnerable to a high-temperature atmosphere from being damaged during deposition processing.

The second encapsulation layer PCL may be formed in an area smaller than the area of the first encapsulation layer PAS1. In this case, the second encapsulation layer PCL may be formed such that both ends of the first encapsulation layer PAS1 are exposed. The second encapsulation layer PCL may serve as a buffer to reduce stress between layers due to bending of the display device 100, and may also serve to enhance planarization performance. For example, the second encapsulation layer PCL may be formed of an acrylic resin, an epoxy resin, polyimide, polyethylene, silicon oxycarbide (SiOC), or the like, or may be formed of an organic insulating material. For example, the second encapsulation layer PCL may be formed using an inkjet method.

The third encapsulation layer PAS2 may be formed on the substrate SUB including the second encapsulation layer PCL to cover a top surface and a side surface of each of the second encapsulation layer PCL and the first encapsulation layer PAS1. The third encapsulation layer PAS2 may minimize or block penetration of external moisture or oxygen into the first encapsulation layer PAS1 or the second encapsulation layer PCL. For example, the third encapsulation layer PAS2 is formed of an inorganic insulating material such as silicon nitride ($SiN_x$), silicon oxide ($SiO_x$), silicon oxynitride (SiON), or aluminum oxide ($Al_2O_3$).

Referring to FIG. 7, in an in-cell display panel PNL in which the touch sensors TS are disposed inside the display panel PNL, the touch sensors TS may be disposed on the encapsulation layer ENCAP. The structure of each of the touch sensors will be described as follows.

A touch buffer film T-BUF may be disposed on the encapsulation layer ENCAP. The touch sensors TS may be disposed on the touch buffer film T-BUF.

Each of the touch sensors TS may include touch sensor metals TSM and a bridge metal BRG located on different layers.

A touch interlayer insulating film T-ILD may be disposed between the touch sensor metals TSM and the bridge metal BRG.

For example, the touch sensor metals TSM may include a first touch sensor metal TSM, a second touch sensor metal TSM, and a third touch sensor metal TSM disposed adjacent to each other. The third touch sensor metal TSM is present between the first touch sensor metal TSM and the second touch sensor metal TSM. When the first touch sensor metal TSM and the second touch sensor metal TSM are to be electrically connected to each other, the first touch sensor metal TSM and the second touch sensor metal TSM may be electrically connected to each other through the bridge metal BRG located on a different layer. The bridge metal BRG may be insulated from the third touch sensor metal TSM by the touch interlayer insulating film T-ILD.

When the touch sensors TS are formed on the display panel PNL, the display panel PNL may be exposed to an agent (e.g., a developing solution or an etchant) used in processing, external moisture, or the like. Since the touch sensors TS are disposed on the touch buffer film T-BUF, penetration of the agent, moisture, or the like into the emitting layer EL including an organic material during fabrication of the touch sensors TS may be prevented. Thus, the touch buffer film T-BUF may prevent the emitting layer EL vulnerable to the agent or moisture from being damaged.

In order to prevent the emitting layer EL including an organic material vulnerable to high temperature from being damaged, the touch buffer film T-BUF is formed of an organic insulating material that may be formed at a low temperature of a predetermined temperature (e.g., 100° C.) or lower and has a low permittivity of 1 to 3. For example, the touch buffer film T-BUF may be formed of an acrylic material, an epoxy-based material, or a siloxane-based material. Due to bending of the display device 100, the encapsulation layer ENCAP may be damaged, and the touch sensor metals located on the touch buffer film T-BUF may be fractured. Even in the case that the display device 100 is bent, the touch buffer film T-BUF formed of an organic insulating material and having planarization performance may prevent at least one of damage to the encapsulation layer ENCAP and fracture of the metals TSM and BRG of the touch sensors TS.

A passivation layer PAC may be disposed to cover the touch sensors TS. The passivation layer PAC may be an organic insulating film.

Next, a layered structure of the first optical area OA1 will be described with reference to FIGS. 6 and 7.

Referring to FIGS. 6 and 7, the emitting areas EA in the first optical area OA1 may have a layered structure the same as the layered structure of the emitting areas EA in the normal area NA. Thus, hereinafter, the layered structure of the first transmission areas TA1 in the first optical area OA1 will be described in detail.

Although the cathode CE is disposed in each of the emitting areas EA included in the normal area NA and the first optical area OA1, no cathode may be disposed in the first transmission areas TA1 in the first optical area OA1. That is, each of the first transmission areas TA1 in the first optical area OA1 may correspond to an open area of the cathode CE.

In addition, in each of the emitting areas included in the normal area NA and the first optical area OA1, the light shield layer LS including at least one of the first metal layer ML1 and the second metal layer ML2 is disposed. In contrast, in each of the first transmission areas TA1 in the first optical area OA1, the light shield layer LS may not be disposed. That is, each of the first transmission areas TA1 in the first optical area OA1 may correspond to an open area of the light shield layer LS.

The substrate SUB and the variety of insulating films MBUF, ABUF1, ABUF2, GI, ILD1, ILD2, PAS0, PLN (PLN1, PLN2, PLN3, and PLN4), BANK, ENCAP (PAS1, PCL, and PAS2), T-BUF, T-ILD, and PAC disposed in each of the emitting areas included in the normal area NA and the first optical area OA1 may also be disposed in each of the first transmission areas TA1 in the first optical area OA1 in the same manner.

However, in the emitting area EA included in the normal area NA and the first optical area OA1, a material layer having electrical conductive characteristics (e.g., a metal material layer), except for an insulating material, may not be disposed in the first transmission areas TA1 in the first optical area OA1.

For example, referring to FIGS. 6 and 7, none of the metal material layers ML1, ML2, GATE, GM, TM, SD1, and SD2 related to the transistor may be disposed in the first transmission areas TA1.

In addition, referring to FIGS. 6 and 7, none of the anode AE and the cathode CE included in the emitting device ED may be disposed in the first transmission areas TA1. Here, the emitting layer EL may or may not be disposed in the first transmission areas TA1.

In addition, referring to FIG. 7, none of the touch sensor metals TSM and the bridge metal BRG included in the touch sensor TS may be disposed in the first transmission areas TA1 in the first optical area OA1.

Thus, since a material layer having electrical conductive characteristics (e.g., a metal material layer) is not disposed in the first transmission areas TA1 in the first optical area OA1, the first transmission areas TA1 in the first optical area OA1 may have light transmittance. Accordingly, the first optoelectronic device 11 may perform a designated function (e.g., an image sensing function) by receiving light that has passed through the first transmission areas TA1.

Since the entirety of or a portion of the first transmission areas TA1 in the first optical area OA1 overlaps the first optoelectronic device 11, for normal operations of the first optoelectronic device 11, the transmittance of the first transmission areas TA1 in the first optical area OA1 is required to be further increased.

In this regard, in the display panel PNL of the display device 100 according to embodiments of the present disclosure, the first transmission areas TA1 in the first optical area OA1 may have a transmittance improvement structure (TIS).

Referring to FIGS. 6 and 7, a plurality of insulating films included in the display panel PNL may include: the buffer layers MBUF, ABUF1, and ABUF2 between the substrates SUB1 and SUB2 and the transistor TFT; the planarization layers PLN1, PLN2, PLN3, and PLN4 between the transistor TFT and the emitting device ED; the encapsulation layer ENCAP on the emitting device ED; and the like.

Referring to FIG. 7, the plurality of insulating films included in the display panel PNL may further include the touch buffer film T-BUF, the touch interlayer insulating film T-ILD, and the like on the encapsulation layer ENCAP.

Referring to FIGS. 6 and 7, the first transmission areas TA1 in the first optical area OA1 may have a structure in which the first planarization layer PLN1 and the passivation layer PAS0 are depressed downward as the transmittance improvement structure.

Referring to FIGS. 6 and 7, the first planarization layer PLN1 among the plurality of insulating films may include at least one concave-convex portion (or depressed portion). Here, the first planarization layer PLN1 may be an organic insulating film.

When the first planarization layer PLN1 is depressed downward, the second planarization layer PLN2 may substantially serve as a planarization layer.

A plurality of connection patterns CP may be disposed on the planarized second planarization layer PLN2, and the third planarization layer PLN3 may be disposed to cover the plurality of connection patterns CP on the second planarization layer PLN2.

In addition, a plurality of connection patterns CP may be disposed on the third planarization layer PLN3. Referring to FIGS. 6 and 7, the depressed portions of the first planarization layer PLN1 and the passivation layer PAS0 may reach a top portion of the second substrate SUB2 by extending downward through the insulating films ILD2, IDL1, and GI and the buffer layers ABUF1, ABUF2, and MBUF located below the insulating films ILD2, IDL1, and GI.

Referring to FIGS. 6 and 7, the substrate SUB may include at least one recessed portion as the transmittance improvement structure. For example, in the first transmission areas TA1, the top surface of the second substrate SUB2 may be depressed or perforated.

Referring to FIG. 7, the passivation layer PAC may be disposed to cover the touch sensors TS on the encapsulation layer ENCAP to protect the touch sensors TS.

Referring to FIG. 7, the passivation layer PAC may have at least one concave-convex portion in a portion thereof overlapping the first transmission areas TA1 as the transmittance improvement structure. Here, the passivation layer PAC may be an organic insulating film.

Referring to FIG. 7, each of the touch sensors TS may be comprised of a mesh-type touch sensor metal TSM. When the touch sensor metal TSM is a mesh-type sensor metal, a plurality of open areas may be present in the touch sensor metal TSM. The positions of the plurality of open areas may correspond to the positions of the emitting areas EA of the subpixels SP, respectively.

The area of the touch sensor metal TSM per unit area in the first optical area OA1 may be smaller than the area of the touch sensor metal TSM per unit area in the normal area NA so that the transmittance of the first optical area OA1 is higher than the transmittance of the normal area NA.

Referring to FIG. 7, the touch sensors TS may be disposed in the emitting areas in the first optical area OA1, and none of the touch sensors TS may be disposed in the first transmission areas TA1 in the first optical area OA1.

Next, a layered structure of the second optical area OA2 will be described with reference to FIGS. 6 and 7.

Referring to FIGS. 6 and 7, the layered structure of the emitting areas EA in the second optical area OA2 may be the same as the layered structure of the emitting areas EA in the normal area NA. Thus, hereinafter, a layered structure of the second transmission areas TA2 in the second optical area OA2 will be described in detail.

The cathode CE is disposed in each of the emitting areas EA included in the normal area NA and the second optical area OA2, while no cathode may be disposed in the second transmission areas TA2 in the second optical area OA2. That is, the second transmission areas TA2 in the second optical area OA2 may correspond to the open areas of the cathodes CE.

In addition, the light shield layer LS including at least one of the first metal layer ML1 and the second metal layer ML2 is disposed in the emitting areas EA included in the normal area NA and the second optical area OA2, while the light shield layer LS may not be disposed in the second transmission areas TA2 in the second optical area OA2. That is, the second transmission areas TA2 in the second optical area OA2 may correspond to the open areas of the light shield layer LS.

When the transmittance of the second optical area OA2 is the same as the transmittance of the first optical area OA1, the layered structure of the second transmission areas TA2 in the second optical area OA2 may be completely the same as the layered structure of the first transmission areas TA1 in the first optical area OA1.

When the transmittance of the second optical area OA2 is different from the transmittance of the first optical area OA1, the layered structure of the second transmission areas TA2 in the second optical area OA2 may be partially different from the layered structure of the first transmission areas TA1 in the first optical area OA1.

For example, as illustrated in FIGS. 6 and 7, when the transmittance of the second optical area OA2 is lower than the transmittance of the first optical area OA1, the second transmission areas TA2 in the second optical area OA2 may not have the transmittance improvement structure. For example, none of the first planarization layer PLN1 and the passivation layer PAS0 may be depressed. In addition, the width of the second transmission areas TA2 in the second optical area OA2 may be narrower than the width of the first transmission areas TA1 in the first optical area OA1.

The substrate SUB and the variety of insulating films MBUF, ABUF1, ABUF2, GI, ILD1, ILD2, PAS0, PLN (PLN1, PLN2, PLN3, and PLN4), BANK, ENCAP (PAS1, PCL, and PAS2), T-BUF, T-ILD, and PAC disposed in the emitting areas EA included in the normal area NA and the second optical area OA2 may be equally disposed in the second transmission areas TA2 in the second optical area OA2.

However, in the emitting areas EA included in the normal area NA and the second optical area OA2, a material layer having electrical conductive characteristics (e.g., a metal material layer), except for an insulating material, may not be disposed in the second transmission areas TA2 in the second optical area OA2.

For example, referring to FIGS. 6 and 7, none of the metal material layers ML1, ML2, GATE, GM, TM, SD1, and SD2 related to the transistor may be disposed in the second transmission areas TA2 in the second optical area OA2.

In addition, referring to FIGS. 6 and 7, none of the anode AE and the cathode CE included in the emitting device ED may be disposed in the second transmission areas TA2 in the second optical area OA2. Here, the emitting layer EL may or may not be disposed in the second transmission areas TA2 in the second optical area OA2.

In addition, referring to FIG. 7, none of the touch sensor metal TSM and the bridge metal BRG included in the touch sensors TS may be disposed in the second transmission areas TA2 in the second optical area OA2.

Thus, since a material layer having electrical conductive characteristics (e.g., a metal material layer) is not disposed in the second transmission areas TA2 in the second optical area OA2, the second transmission areas TA2 in the second optical area OA2 may have light transmittance. Accordingly, the second optoelectronic device 12 may perform a designated function (e.g., a function of detecting an approach of an object or a human body or a function of detecting luminous intensity of external light) by receiving light that has passed through the second transmission areas TA2.

Figure 8:
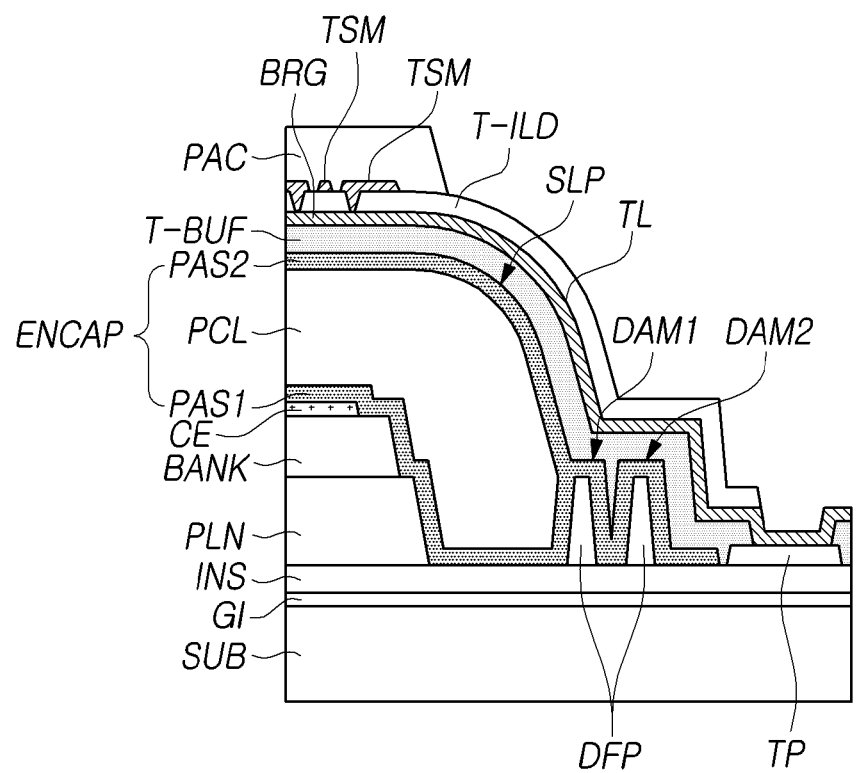
FIG. 8 is a cross-sectional diagram of a peripheral portion of the display panel according to embodiments of the present disclosure.

FIG. 8 is a cross-sectional diagram of a peripheral portion of the display panel PNL according to embodiments of the present disclosure.

In FIG. 8, a substrate SUB in which a first substrate SUB1 and a second substrate SUB2 are integrated is illustrated, and a bottom portion of the bank BANK is schematically illustrated. In FIG. 8, the first planarization layer PLN1 and the second planarization layer PLN2 are illustrated as a single planarization layer PLN, and the second interlayer insulating film ILD2 and the first interlayer insulating film ILD1 below the planarization layer PLN are illustrated as a single interlayer insulating film INS.

Referring to FIG. 8, the first encapsulation layer PAS1 may be disposed on the cathode CE and most adjacent to the emitting device ED. The second encapsulation layer PCL may be formed such that the area thereof is smaller than the area of the first encapsulation layer PAS1. In this case, the second encapsulation layer PCL may be formed so as to expose both ends of the first encapsulation layer PAS1.

The third encapsulation layer PAS2 may be formed on the substrate SUB on which the second encapsulation layer PCL is formed so as to cover a top surface and a side surface of each of the second encapsulation layer PCL and the first encapsulation layer PAS1.

The third encapsulation layer PAS2 minimizes or blocks penetration of external moisture or oxygen into the first encapsulation layer PAS1 or the second encapsulation layer PCL.

Referring to FIG. 8, in the display panel PNL, one or more dams DAM1 and DAM2 may be present at or around a terminal end of a slope SLP of the encapsulation layer ENCAP in order to prevent the encapsulation layer ENCAP from collapsing. The one or more dams DAM1 and DAM2 may be present at or around the boundary between the display area DA and the non-display area NDA.

The one or more dams DAM1 and DAM2 may include a material DFP the same as the material of the bank BANK.

Referring to FIG. 8, the second encapsulation layer PCL including an organic material may only be located on the inner surface of the first dam DAM1 located innermost the dams DAM1 and DAM2. That is, the second encapsulation layer PCL may not be present on both top portions of the dams DAM1 and DAM2. Alternatively, the second encapsulation layer PCL including an organic material may be located at least on the top portion of the first dam DAM1 of the first and second dams DAM1 and DAM2.

The second encapsulation layer PCL may extend to and located on the top portion of the first dam DAM1. Alternatively, the second encapsulation layer PCL may extend to and located on the top portion of the second dam DAM2 by extending beyond the first dam DAM1.

Referring to FIG. 8, a touch pad TP to which the touch driver circuit TDC is electrically connected may be disposed outside of the one or more dams DAM1 and DAM2.

A touch line TL may electrically connect the touch sensor metal TSM or the bridge metal BRG of the touch electrode disposed in the display area DA to the touch pad TP.

One end of the touch line TL may be electrically connected to the touch sensor metal TSM or the bridge metal BRG, while the other end of the touch line TL may be electrically connected to the touch pad TP.

The touch line TL may extend downward along the slope SLP of the encapsulation layer ENCAP to cover the top portions of the dams DAM1 and DAM2 and reach the touch pad TP disposed outside of the dams DAM1 and DAM2.

Referring to FIG. 8, the touch line TL may be the bridge metal BRG. Alternatively, the touch line TL may be the touch sensor metal TSM.

Figure 9:
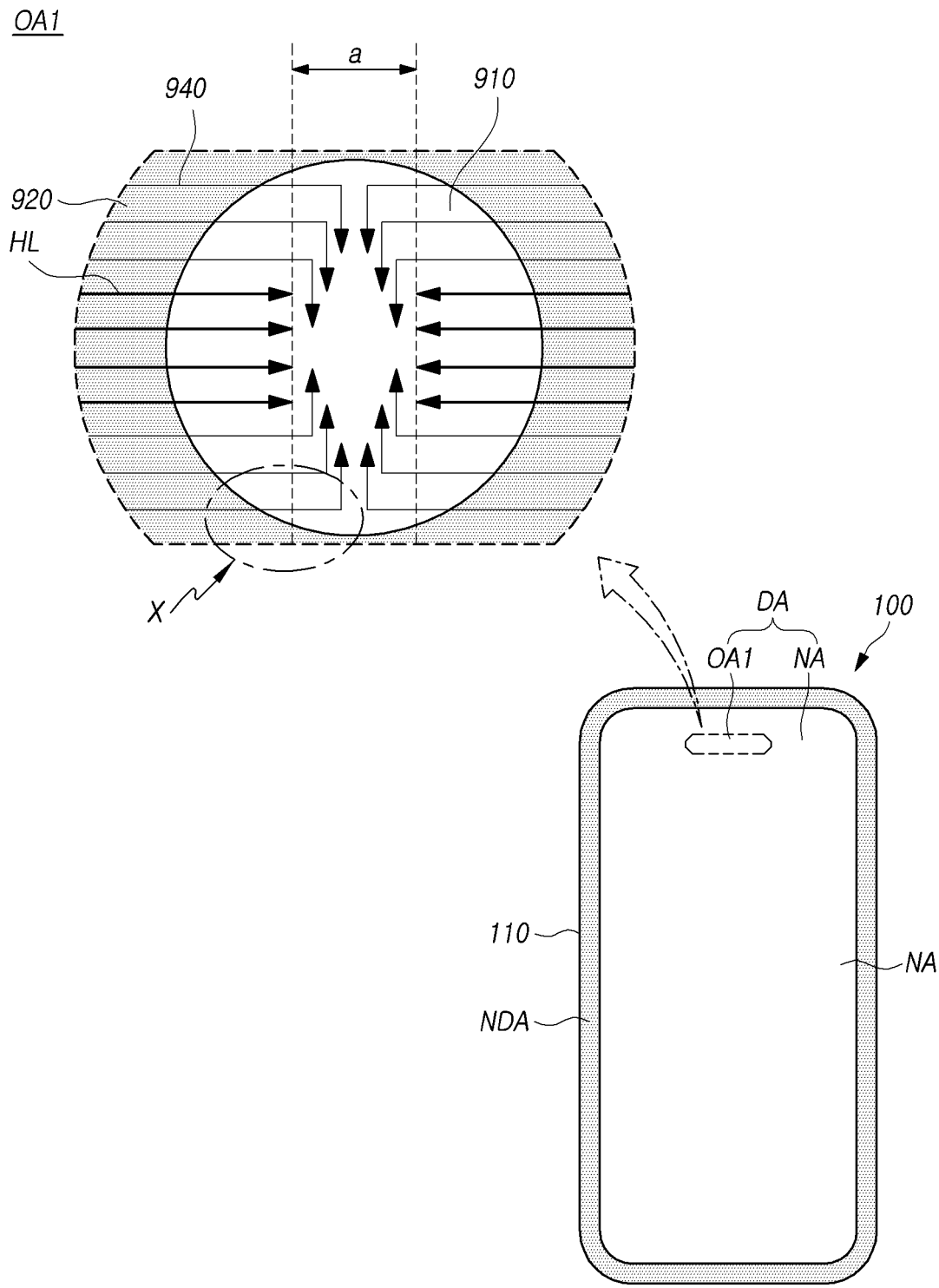
FIG. 9 is a plan diagram of the first optical area of the display device according to embodiments of the present disclosure.

FIG. 9 is a plan diagram of the first optical area OA1 of the display device according to embodiments of the present disclosure.

Referring to FIG. 9, the first optical area OA1 may include a central area 910 and a bezel area 920 located outside of the central area 910.

The first optical area OA1 may include a plurality of horizontal lines HL. The transistors located in the bezel area 920 and the emitting devices located in the central area 910 may be connected through the plurality of horizontal lines HL.

The display device according to embodiments may include a routing structure 940. Since the display device includes the routing structure 940, the central area 910 may be increased by a predetermined area a. This is because the pixels located in the predetermined area a may be connected to the transistors located in the bezel area 920 of the optical area OA1 through the routing structure 940. As noted herein, this bezel area is different from the second bezel area that is in the non-display area.

The structure of the first optical areas OA1 including the routing structure 940 will be reviewed in detail as follows.

Figure 10:
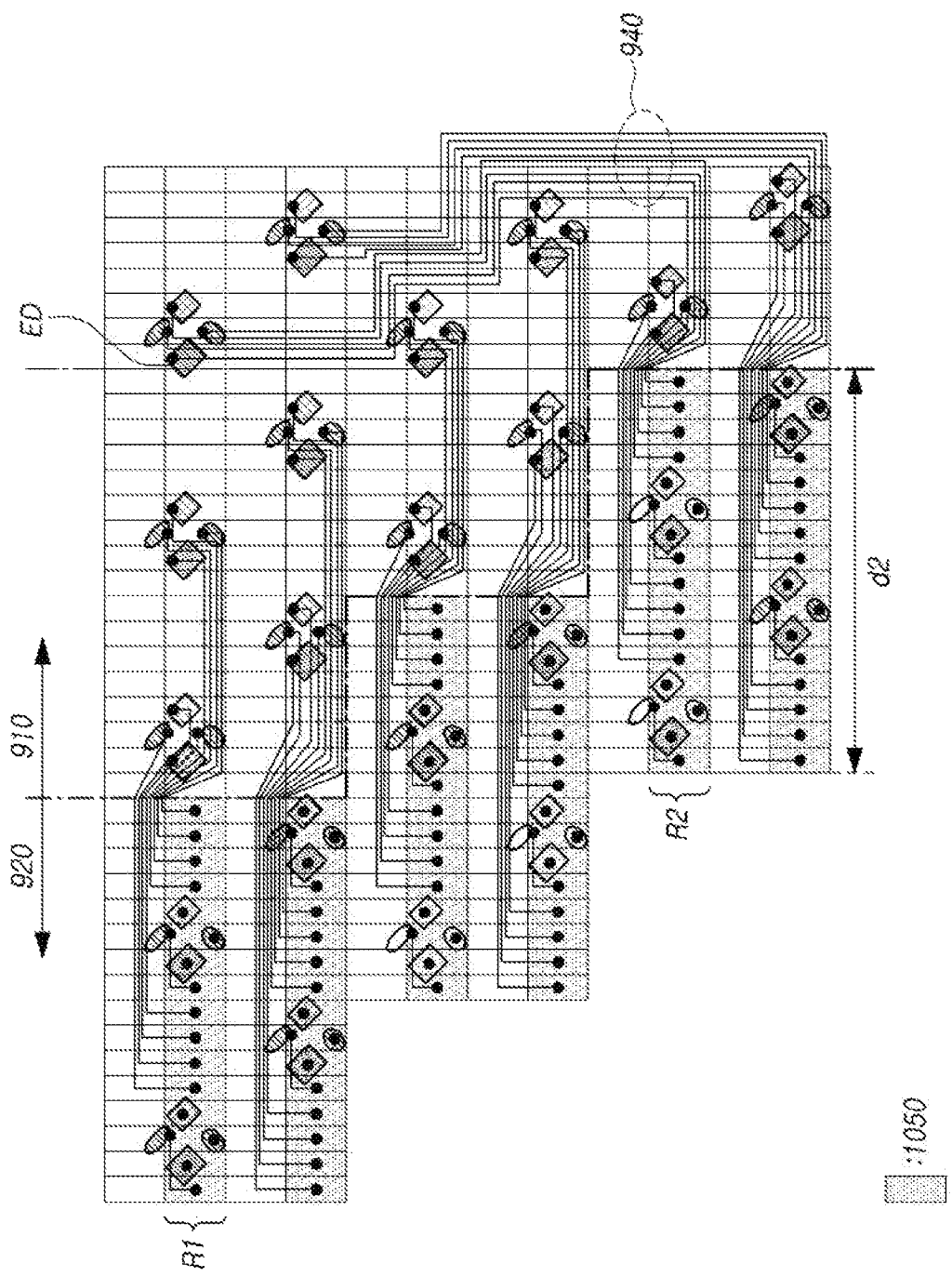
FIG. 10 is an enlarged diagram of area X in FIG. 9.

FIG. 10 is an enlarged diagram of area X in FIG. 9.

Referring to FIG. 10, the first optical area OA1 may include a plurality of emitting device ED located in the central area 910 and the bezel area 920. Since the first optical area OA1 includes the plurality of emitting device ED, the first optical area may display an image.

The first optical area OA1 may include a plurality of transistors 1050 located in the bezel area 920. None of the transistors 1050 may be located in the central area 910. Since no transistors are located in the central area 910, the central area 910 may have a higher level of transmittance.

The first optical area may include a plurality of rows, in particular, a first row R1 and a second row R2. The plurality of rows included in the first optical area may be a predetermined area crossing the first optical area in a horizontal direction and defined by the pattern of the transistors 1050. In the bezel area 920, a transistor area in which the plurality of transistors 1050 are disposed in each of a plurality of rows may have a predetermined length d2 in a row direction. The plurality of transistors 1050 may be disposed only in the transistor area, which is a partial area among the entire area of each of the plurality of rows. Accordingly, the length d2 of the transistor area in the row direction may be shorter than the length of each of the plurality of rows in the row direction.

The display device may include the emitting devices ED located in the central area 910 and in the first row R1 and transistors 1050 located in the bezel area 920 and in the second row R2.

The display device may include the routing structure 940 electrically connecting an emitting device among the emitting devices ED located in the first row R1 to a corresponding transistor among the transistors 1050 located in the second row R2.

Since the transistor 1050 and the emitting device ED located in different rows may be connected to each other by the routing structure 940, transistors located in a row in which a greater number of transistors than emitting devices are disposed may be connected to emitting devices located in a row in which a greater number of emitting devices than transistors are disposed. For example, some transistors among the plurality of transistors disposed in the bezel area 920 may be electrically connected to at least one emitting device among the plurality of emitting devices disposed in the bezel area 920, and the remaining transistors among the plurality of transistors disposed in the bezel area 920 may be electrically connected to at least one emitting device among the plurality of emitting devices disposed in the central area 910.

The number of the emitting devices ED that the central area 910 includes in the first row R1 may be greater than the number of the emitting devices that the central area 910 includes in the second row R2. Thus, a greater number of transistors are required to drive the emitting device ED in the first row R1, while a smaller number of transistors are required to drive the emitting devices ED in the second row R2. Thus, extra transistors not electrically connected to the emitting devices located in the second row R2, among the transistors located in the second row R2 of the bezel area 920, may be electrically connected to the emitting devices ED located in the first row R1 by the routing structure 940.

The central area 910 may be configured such that the number of pixels per unit area is substantially uniform across the entirety of the central area 910. The number of pixels per unit area being uniform across the entirety of the central area 910 means that, for example, a single pixel pattern is substantially uniform across the entirety of the central area 910. Thus, in the first row R1 having a larger area overlapping the central area 910 than the second row R2, a greater number of emitting devices ED may be located.

For example, the number of transistors 1050 that the bezel area 920 includes in the first row R1 may be substantially the same as the number of transistors 1050 that the bezel area 920 includes in the second row R2. In the above example, when the central area 910 includes a greater number of emitting devices ED in the first row R1 and a smaller number of emitting devices ED in the second row R2, a portion of the transistors 1050 in the second row R2 may be electrically connected to the emitting device ED in the first row R1 instead of being electrically connected to the emitting device ED in the second row R2.

The bezel area 920 may be configured such that the number of transistors per unit area is substantially uniform across the entirety of the bezel area 920. The number of transistors per unit area being uniform across the entirety of the bezel area 920 may mean that a single transistor pattern is substantially uniform across the entirety of the bezel area 920.

The size of an area of the bezel area 920 overlapping the first row R1 may be substantially the same as the size of an area of the bezel area 920 overlapping the second row R2. In this example, the number of the transistors 1050 located in the first row R1 of the bezel area 920 may be substantially the same as the number of the transistors 1050 located in the second row R2 of the bezel area 920.

When the bezel area 920 is configured as above, the number of the transistors 1050 located in a row of the bezel area 920 may be maintained the same, and extra transistors in a specific row may be electrically connected to extra emitting devices in another row by the routing structure 940. Thus, the central area 910 of the display device according to embodiments may be wider than that of a display device of the related art.

The display device according to embodiments of the present disclosure described as above will be briefly reviewed as follows.

The display device 100 according to embodiments of the present disclosure may include the display area DA, the emitting device ED, the transistors 1050, and the routing structure 940.

The display area DA may include the first optical area OA1 and the normal area NA. The first optical area OA1 may include the central area 910 and the bezel area 920 located outside of the central area 910. The first optical area OA1 may include the first row R1 and the second row R2.

The emitting device ED may be located in the central area 910 and in the first row R1.

The transistors 1050 may be located in the bezel area 920 and in the second row R2.

The routing structure 940 may electrically connect the emitting devices located in the central area 910 and in the first row R1 and the transistors located in the bezel area 920 and in the second row R2.

The first optical area OA1 may include the plurality of emitting devices ED located in the central area 910 and the bezel area 920.

The first optical area OA1 may include the plurality of transistors 1050 located in the bezel area 920.

None of the transistors 1050 may be located in the central area 910.

The central area 910 may include the plurality of emitting devices ED. The number of the emitting device ED that the central area 910 includes in the first row R1 may be much greater than the number of the emitting devices that the central area 910 includes in the second row R2.

The central area 910 may be configured such that the number of pixels per unit area is substantially uniform across the entirety of the central area 910. The size of an area of the central area 910 overlapping the first row R1 may be greater than the size of an area of the central area 910 overlapping the second row R2.

The bezel area 920 may include a plurality of transistors 1050. The number of the transistors 1050 that the bezel area 920 includes in the first row R1 may be substantially the same as the number of the transistors 1050 that the bezel area 920 includes in the second row R2.

The bezel area 920 may be configured such that the number of the transistors 1050 per unit area is substantially uniform across the entirety of the bezel area 920. The size of an area of the bezel area 920 overlapping the first row R1 may substantially the same as the size of an area of the bezel area 920 overlapping the second row R2.

The structure of the display device according to embodiments of the present disclosure as described above will be reviewed in detail as follows.

FIGS. 11 to 14 are diagrams illustrating portions of the normal area and the first optical area included in the display area of the display device according to embodiments of the present disclosure having the routing structure.

The routing structure illustrated in FIGS. 11 to 14 may be realized using a plurality of connection patterns.

Figure 11:
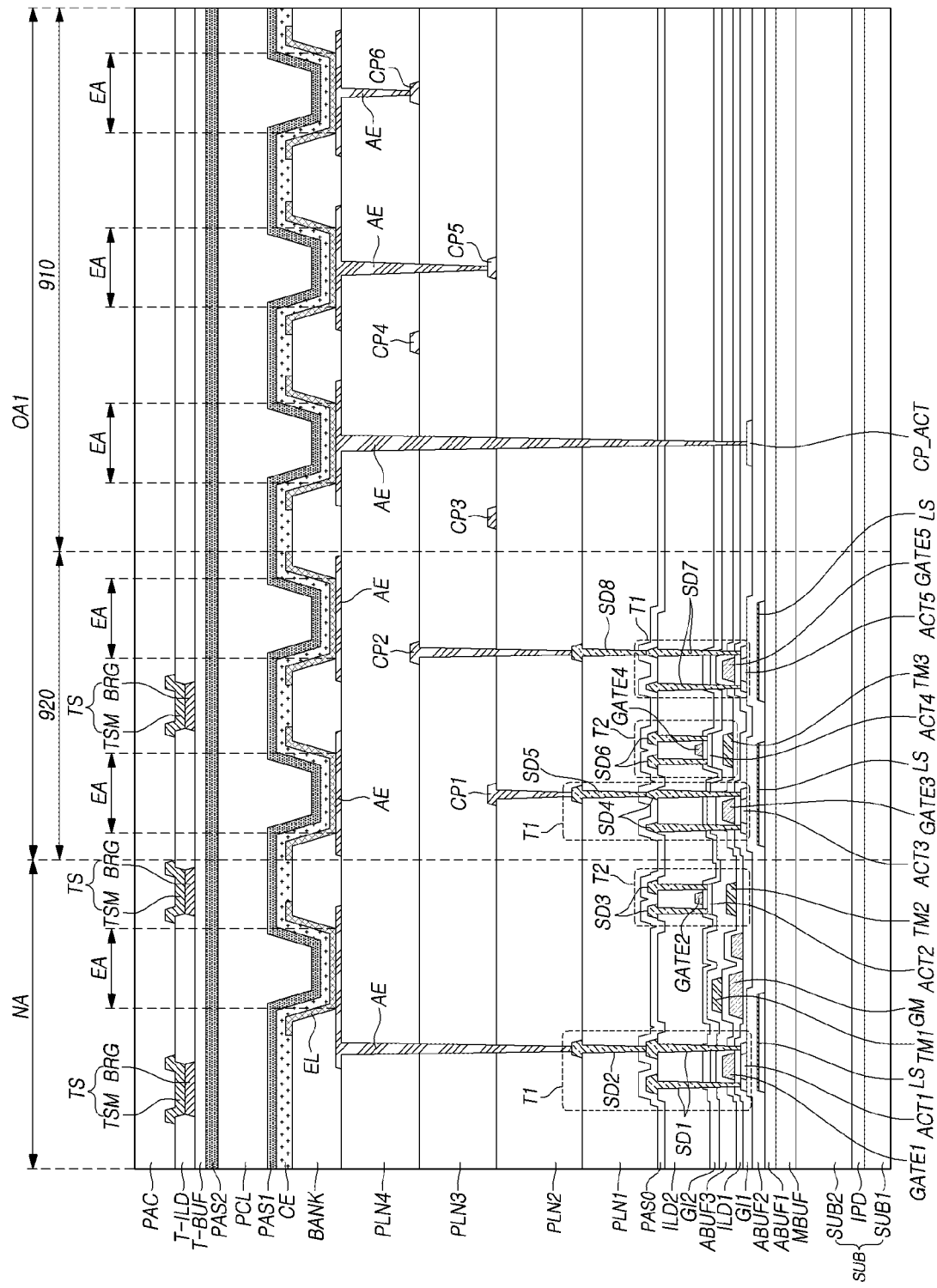
FIGS. 11 to 14 are diagrams illustrating portions of the normal area and the first optical area included in the display area of the display device according to various embodiments of the present disclosure having the routing structure.
Figure 12:
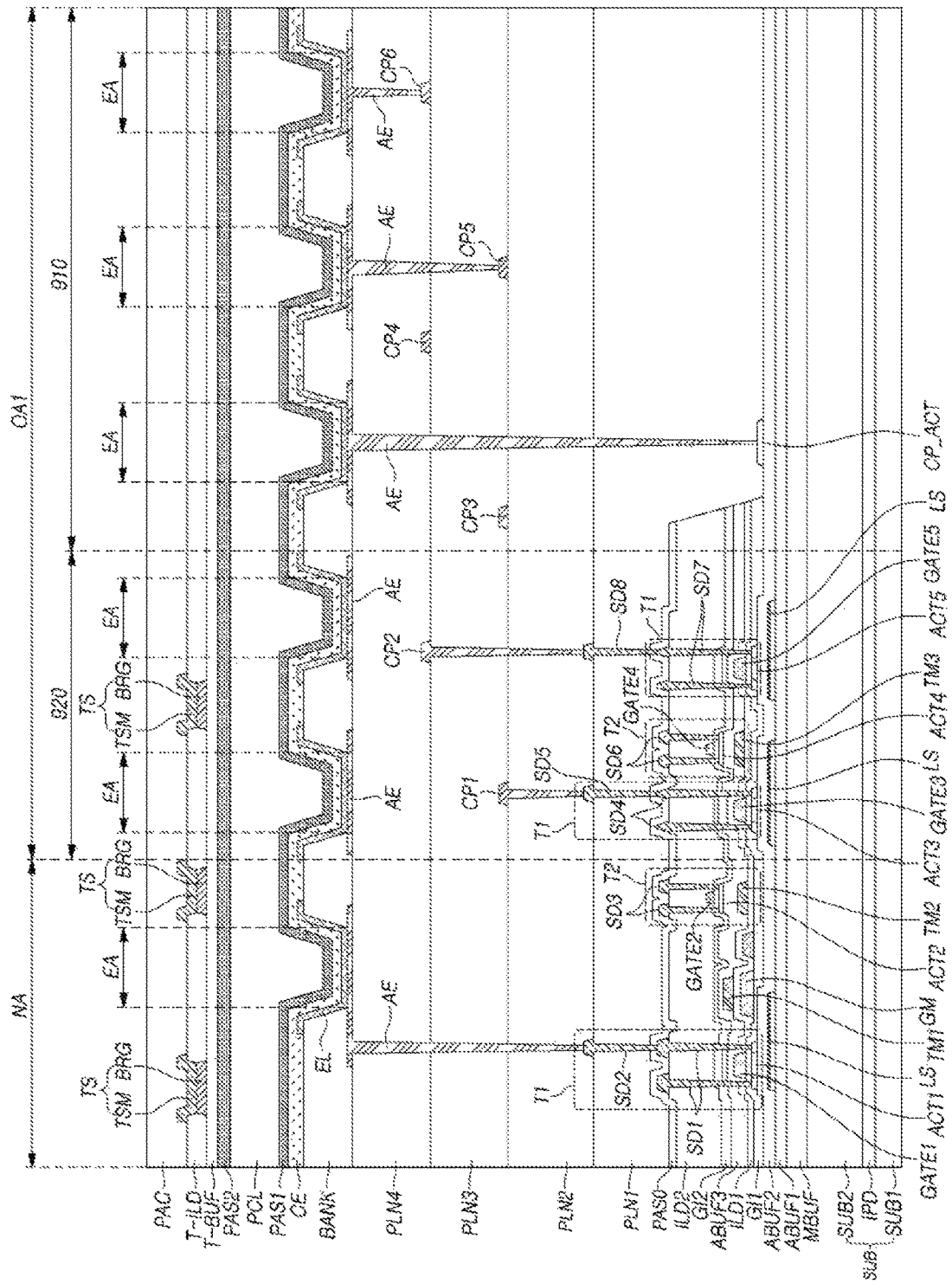

FIG. 11 illustrates cross-sections of the display panel PNL in a case in which the touch sensors are present outside the display panel PNL as the touch panel, and FIG. 12 illustrates cross-sections of the display panel PNL in a case in which the touch sensors are present inside the display panel PNL.

FIGS. 11 to 14 illustrate cross-sectional structures of the normal area NA and the central area 910 and the bezel area 920 of the first optical area OA1 included in the display area DA.

With reference to FIGS. 11 to 14, a layered structure of the normal area NA will be described. The layered structure of the normal area NA illustrated in FIGS. 11 to 14 may be similar to the layered structure of the normal area NA illustrated in FIGS. 6 and 7.

Here, as illustrated in FIGS. 11 to 14, a plurality of transistors may be disposed in at least one subpixel of the normal area NA.

Specifically, a plurality of transistors T1 and T2 may be disposed in at least one subpixel of the normal area NA. Here, the plurality of transistors may include a first transistor T1 and a second transistor T2. The first transistor T1 may be a driving transistor, while the second transistor T2 may be a scanning transistor. However, the type and structure of the transistor according to embodiments of the present disclosure are not limited thereto, but the first transistor T1 may be a scanning transistor, the second transistor T2 may be a driving transistor, the first and second transistors T1 and T2 may be the same type of TFTs.

Although a structure in which two transistors are disposed in the normal area NA is illustrated in FIGS. 11 to 14, the structure according to the present embodiments is not limited thereto. Rather, a structure in which at least two transistors are disposed in each of the subpixels in the normal area NA may be used.

Referring to FIGS. 11 to 14, the substrate SUB may include a first substrate SUB1, an interlayer insulating film IPD, and a second substrate SUB2.

A variety of patterns ACT1, SD1, and GATE1 for forming transistors such as the first transistor T1, a variety of insulating films MBUF, ABUF1, ABUF2, ABUF3, GI1, GI2, ILD1, ILD2, and PAS0, and a variety of metal patterns TM1, GM, and LS may be disposed on the substrate SUB.

In addition, a variety of patterns ACT2, GATE2, and SD3 included in the second transistor T2 may be disposed on the substrate SUB.

Referring to FIGS. 11 to 14, a second metal pattern TM2 may be disposed on the first interlayer insulating film ILD1.

A third active buffer layer ABUF3 may be disposed on the second metal pattern TM2.

A second active layer ACT2 of the second transistor T2 may be disposed on the third active buffer layer ABUF3.

Here, a first active layer ACT1 of the first transistor T1 and the second active layer ACT2 of the second transistor T2 may be different types, meaning, they are comprised of different types of semiconductor material.

For example, the first active layer ACT1 may include a polysilicon material, and the second active layer ACT2 may include a metal oxide material. Here, the first transistor T1 may be a thin-film transistor using a low-temperature polysilicon (LTPS) for the active layer ACT1, while the second transistor T2 may be an oxide semiconductor thin-film transistor using an oxide semiconductor for the active layer ACT2.

However, the types of active layers for the transistors according to embodiments of the present disclosure are not limited thereto.

The type of the first active layer ACT1 of the first transistor T1 and the type of the second active layer ACT2 of the second transistor T2 may be the same.

For example, each of the first active layer ACT1 and the second active layer ACT2 may include a metal oxide material or a polysilicon material for the semiconductor material.

A second gate insulating film GI2 may be disposed on the second active layer ACT2.

A second gate electrode GATE2 of the second transistor T2 may be disposed on the second gate insulating film GI2.

A second interlayer insulating film ILD2 may be disposed on the second gate electrode GATE2.

Two third source-drain electrode patterns SD3 may be disposed on the second interlayer insulating film ILD2.

A portion of the second active layer ACT2 overlapping the second gate electrode GATE2 may be a channel area.

One of the two third source-drain electrode patterns SD3 may be connected to one side of the second active layer ACT2, while the other one of the two third source-drain electrode patterns SD3 may be connected to the other side of the second active layer ACT2.

Referring to FIGS. 11 to 14, the second active layer ACT2 may overlap the second metal pattern TM2. Specifically, the second metal pattern TM2 may overlap the channel area of the second active layer ACT2 to block light entering the second active layer ACT2.

A passivation layer PAS0 may be disposed on the first and third source-drain electrode patterns SD1 and SD3.

In the normal area NA, a layered structure on the passivation layer PAS0 may be the same as the structure illustrated in FIGS. 6 and 7.

Specifically, the layered structure of the passivation layer PAS0, first planarization layer PLN1, a second planarization layer PLN2, a third planarization layer PLN3, a fourth planarization layer PLN4, a second source-drain electrode pattern SD2, anodes AE, banks BANK, emitting layers EL, cathodes CE, an encapsulation layer ENCAP, a touch buffer film T-BUF, touch sensors TS, a touch interlayer insulating film T-ILD, and a passivation layer PAC illustrated in FIGS. 11 to 14 may be the same as the layered structure of the passivation layer PAS0, the first planarization layer PLN1, the second planarization layer PLN2, the third planarization layer PLN3, the fourth planarization layer PLN4, the second source-drain electrode pattern SD2, the anodes AE, the banks BANK, the emitting layers EL, the cathodes CE, the encapsulation layer ENCAP, the touch buffer film T-BUF, the touch sensors TS, the touch interlayer insulating film T-ILD, and the passivation layer PAC illustrated in FIGS. 6 and 7.

Although the structure in which the first to fourth planarization layers PLN1 to PLN4 are disposed in the normal area NA and the first optical area OA1 is illustrated in FIGS. 11 to 14, at least one planarization layer may be disposed in the non-display area NDA (see FIG. 2) of the display panel PNL according to embodiments of the present disclosure, unlike the structure of the normal area NA and the first optical area OA1.

Next, a layered structure of the central area 910 and the bezel area 920 of the first optical area OA1 will be described with reference to FIGS. 11 to 14.

Referring to FIGS. 11 to 14, a plurality of transistors may be disposed in the bezel area 920 of the first optical area OA1, while no transistors may be disposed in the central area 910 of the first optical area OA1.

Specifically, a plurality of first transistors T1 and a plurality of second transistors T2 may be disposed in the bezel area 920.

A variety of patterns ACT3, SD4, SD5, GATE3, ACT5, SD7, SD8, and GATE5 of the plurality of first transistors T1 disposed in the bezel area 920 may be disposed on the same layer as the variety of patterns ACT1, SD1, SD2, and GATE1 of the first transistor disposed in the normal area NA.

For example, the first active layer ACT1 in the normal area NA and a third active layer ACT3 and a fifth active layer ACT5 in the bezel area 920 may be disposed on the same layer.

A first gate electrode GATE1 in the normal area NA and a third gate electrode GATE3 and a fifth gate electrode GATE5 in the bezel area 920 may be disposed on the same layer.

The first source-drain electrode patterns SD1 in the normal area NA may be disposed on the same layer as a fourth source-drain electrode pattern SD4 and a seventh source-drain electrode pattern SD7 in the bezel area 920, and the second source-drain electrode pattern SD2 in the normal area NA may be disposed on the same layer as a fifth source-drain electrode pattern SD5 and an eighth source-drain electrode pattern SD8 in the bezel area 920.

A variety of patterns ACT4, SD6, and GATE4 of the plurality of second transistors T2 disposed in the bezel area 920 may be disposed on the same layer as the variety of patterns ACT2, SD3, and GATE2 of the second transistor disposed in the normal area NA.

For example, the second active layer ACT2 in the normal area NA and the fourth active layer ACT4 in the bezel area 920 may be disposed on the same layer.

The second gate electrode GATE2 in the normal area NA may be disposed on the same layer as the fourth gate electrode GATE4 in the bezel area 920.

The third source-drain electrode patterns SD3 in the normal area NA may be disposed on the same layer as a sixth source-drain electrode pattern SD6 in the bezel area 920.

Referring to FIGS. 11 to 14, the fifth source-drain electrode pattern SD5 of some first transistors T1 among the plurality of first transistors T1 disposed in the bezel area 920 may be in contact with a first connection pattern CP1. In addition, the fourth source-drain electrode pattern SD4 of the remaining first transistors T1 among the plurality of first transistors T1 may be in contact with the fifth source-drain electrode pattern SD5.

The fifth source-drain electrode pattern SD5 may be disposed on the same layer as the second source-drain electrode pattern SD2 in the normal area NA.

That is, the fifth source-drain electrode pattern SD5 may be disposed on the first planarization layer PLN1.

Specifically, the fifth source-drain electrode pattern SD5 of some first transistors T1 among the plurality of first transistors T1 may be in contact with the first connection pattern CP1.

The fourth source-drain electrode pattern SD4 may be disposed on the second interlayer insulating film ILD2, the fifth source-drain electrode pattern SD5 may be disposed on the first planarization layer PLN1, and the first connection pattern CP1 may be disposed on the second planarization layer PLN2 disposed to cover the fifth source-drain electrode pattern SD5.

In addition, the fifth source-drain electrode pattern SD5 and the first connection pattern CP1 may be in contact with each other through a contact hole formed in the second planarization layer PLN2. Accordingly, the first connection pattern CP1 connects various transistors to each other.

The fourth source-drain electrode pattern SD4 and the fifth source-drain electrode pattern SD5 may contain an opaque metal. For example, each of the fourth source-drain electrode pattern SD4 and the fifth source-drain electrode pattern SD5 may contain a metal such as aluminum (Al), gold (Au), silver (Ag), copper (Cu), tungsten (W), molybdenum (Mo), chromium (Cr), tantalum (Ta), or titanium (Ti) or an alloy thereof, but embodiments of the present disclosure are not limited thereto.

The first connection pattern CP1 may contain a transparent conductive material. For example, the first connection pattern CP1 may contain one of indium tin oxide (ITO), indium zinc oxide (IZO), and indium gallium zinc oxide (IGZO), but embodiments of the present disclosure are not limited thereto.

As illustrated in FIGS. 11 to 14, the first connection pattern CP1 disposed in the bezel area 920 of the first optical area OA1 may be disposed to extend to the central area 910.

A plurality of connection patterns CP3 and CP5 may be disposed on the second planarization layer PLN2 in the central area 910.

Each of the plurality of connection patterns CP3 and CP5 disposed on the second planarization layer PLN2 may contain a transparent conductive material. For example, each of the plurality of connection patterns CP3 and CP5 may contain one of ITO, IZO, and IGZO, but embodiments of the present disclosure are not limited thereto.

At least one of the plurality of connection patterns CP3 and CP5 may be electrically connected to the fifth source-drain electrode pattern SD5 of the first transistor T1 disposed in the bezel area 920.

In addition, as illustrated in FIGS. 11 to 14, at least one of the plurality of connection patterns CP3 and CP5 disposed on the second planarization layer PLN2 in the central area 910 may be in contact with one of the anodes AE of the emitting devices ED disposed on the fourth planarization layer PLN4 through a contact hole formed in the third planarization layer PLN3 and the fourth planarization layer PLN4.

In other words, at least one anode among the anodes AE may be in contact with at least one of the plurality of connection patterns CP3 and CP5 disposed on the second planarization layer PLN2, thereby being electrically connected to the first transistor T1 disposed in the bezel area 920.

Although the fourth source-drain electrode pattern SD4 and the fifth source-drain electrode pattern SD5 are illustrated as having a single-layer structure in FIGS. 11 to 14, embodiments of the present disclosure are not limited thereto.

For example, at least one of the plurality of source-drain electrode patterns disposed in the display panel may have a multi-layer structure.

In addition, the seventh source-drain electrode pattern SD7 of the remaining first transistors T1 among the plurality of first transistors T1 may be in contact with the eighth source-drain electrode pattern SD8.

The eighth source-drain electrode pattern SD8 may be in contact with a second connection pattern CP2 disposed on the third planarization layer PLN3. That is, the eighth source-drain electrode pattern SD8 and the second connection pattern CP2 may be in contact with each other through a contact hole.

Specifically, the seventh source-drain electrode pattern SD7 may be disposed on the second interlayer insulating film ILD2, the eighth source-drain electrode pattern SD8 may be disposed on the first planarization layer PLN1, and the second planarization layer PLN2 may be disposed to cover the eighth source-drain electrode pattern SD8. In addition, the second connection pattern CP2 may be disposed on the third planarization layer PLN3 disposed on the second planarization layer PLN2, and the eighth source-drain electrode pattern SD8 and the second connection pattern CP2 may be in contact with each other through a contact hole formed in the second planarization layer PLN2 and the third planarization layer PLN3.

Each of the seventh source-drain electrode pattern SD7 and the eighth source-drain electrode pattern SD8 may contain an opaque metal. For example, each of the seventh source-drain electrode pattern SD7 and the eighth source-drain electrode pattern SD8 may contain a metal such as Al, Au, Ag, Cu, W, Mo, Cr, Ta, or T1 or an alloy thereof, but embodiments of the present disclosure are not limited thereto.

The second connection pattern CP2 may contain a transparent conductive material. For example, the second connection pattern CP2 may contain one of ITO, IZO, and IGZO, but embodiments of the present disclosure are not limited thereto.

As illustrated in FIGS. 11 to 14, the second connection pattern CP2 disposed in the bezel area 920 of the first optical area OA1 may be disposed to extend to the central area 910. A plurality of connection patterns CP4 and CP6 may be disposed on the third planarization layer PLN3 in the central area 910.

Each of the plurality of connection patterns CP4 and CP6 disposed on the third planarization layer PLN3 may contain a transparent conductive material. For example, each of the plurality of connection patterns CP4 and CP6 may contain one of ITO, IZO, and IGZO, but embodiments of the present disclosure are not limited thereto.

At least one of the plurality of connection patterns CP4 and CP6 may be electrically connected to the first transistor T1 disposed in the bezel area 920, together with the second connection pattern CP2.

In addition, as illustrated in FIGS. 11 to 14, at least one among the plurality of connection patterns CP4 and CP6 disposed on the third planarization layer PLN3 in the central area 910 may be in contact with one of the anodes AE of the emitting devices ED disposed on the fourth planarization layer PLN4 through a contact hole formed in the fourth planarization layer PLN4.

In other words, at least one anode among the anodes AE may be in contact with at least one of the plurality of connection patterns CP4 and CP6 disposed on the third planarization layer PLN3, thereby being electrically connected to the first transistor T1 disposed in the bezel area 920. In addition, an active connection pattern CP_ACT may be disposed on a second active buffer layer ABUF2 in the central area 910.

The active connection pattern CP_ACT may be formed concurrently in a process of forming the first active layer ACT1 in the normal area NA and the third active layer ACT3 and the fifth active layer ACT5 in the bezel area 920.

That is, the active connection pattern CP_ACT disposed on the second active buffer layer ABUF2 of the central area 910 may be formed of the same material as the first active layer ACT1 in the normal area NA and the third active layer ACT3 or the fifth active layer ACT5 in the bezel area 920. Thus, the active connection pattern CP_ACT can be composed of polysilicon in one embodiment, of an oxide semiconductor in another embodiment, of a metal oxide semiconductor in another embodiment.

In some embodiments, the active connection pattern CP_ACT may also contain a transparent conductive material. For example, the active connection pattern CP_ACT may contain one of ITO, IZO, and IGZO, but embodiments of the present disclosure are not limited thereto. The ITO, IZO, and IGZO may be overlaid on the active layer in those embodiments in which it is present. Thus, active connection pattern CP-ACT can be composed solely of the material of the semiconductor active layer which is formed at the same time and in the same steps as that particular active layer, whether ACT1, ACT2, ACT2, etc. or it can have two materials stacked on top of each other, the respective active layer material and transparent conductive material, such as ITO, IZO, or IGZO.

The active connection pattern CP_ACT may serve to connect at least two anodes AE to each other of two different light emitting elements. That is, at least two emitting devices ED mat share the active connection pattern CP_ACT.

Here, the anodes AE connected through the active connection pattern CP_ACT may be anodes AE located in emitting areas from which the same color of light is emitted.

As illustrated in FIGS. 11 to 14, the active connection pattern CP_ACT may be in contact with one of the anodes AE of the emitting devices ED disposed on the fourth planarization layer PLN4 through a contact hole provided in the first to fourth planarization layers PLN1 to PLN4 and the variety of insulating films ABUF2, ABUF3, GI1, GI2, ILD1, ILD2, and PAS0.

In other words, at least one anode among the anodes AE of the emitting devices ED in the central area 910 may be in contact with the active connection pattern CP_ACT disposed on the second active buffer layer ABUF2, thereby being electrically connected to the anode AE of another emitting device ED.

As illustrated in FIGS. 11 to 14, since the active connection pattern CP_ACT is formed in the central area 910 of the first optical area OA1 concurrently in the process of forming the first active layer ACT1 in the normal area NA and the third active layer ACT3 and the fifth active layer ACT5 in the bezel area 920, the process may be simplified. Specifically, in order to form two configurations each containing a conductive material to be in contact with each other, a method of disposing an insulating film between the two configurations and forming a bypass line through a contact hole to allow the two configurations to be in contact with each other is typically used.

In contrast, in the display device according to embodiments of the present disclosure, the active connection pattern CP_ACT is formed in the central area 910 of the first optical area OA1 to be on the same layer as the active layers ACT1, ACT3, and ACT5. Thus, the insulating film including the contact hole connecting the anodes AE of the emitting devices ED may be omitted. Therefore, it is possible to reduce the thickness of the display device and obtain a high transmittance in the central area 910, thereby omitting a masking process that would otherwise be performed for this purpose. The active connection pattern CP_ACT can therefore correspond to any one of CP1, CP3 or CP5 as shown in FIGS. 11 to 14.

Referring to FIGS. 11 to 14, the second planarization layer PLN2 may be disposed on the first planarization layer PLN1.

The third planarization layer PLN3 and the fourth planarization layer PLN4 may be sequentially disposed on the second planarization layer PLN2.

The first planarization layer PLN1 among the plurality of insulating films may be formed as an organic insulating film to perform a planarization function. When the first planarization layer PLN1 is depressed downward, the second planarization layer PLN2 may substantially perform a planarization function.

The plurality of connection patterns CP1, CP3, and CP5 may be disposed on the planarized second planarization layer PLN2, and the third planarization layer PLN3 may be disposed to cover the plurality of connection patterns CP1, CP3, and CP5.

In addition, the plurality of connection patterns CP2, CP4, and CP6 may be disposed on the third planarization layer PLN3, and the fourth planarization layer PLN4 may be disposed to cover the plurality of connection patterns CP2, CP4, and CP6.

The anodes AE of the emitting devices ED may be disposed on the fourth planarization layer PLN4.

The anodes AE may contain a transparent conductive material. For example, the anodes AE may contain one of ITO, IZO, and IGZO, but embodiments of the present disclosure are not limited thereto.

The anodes AE disposed in the first optical area OA1 may be electrically connected to the first transistors T1 disposed in the bezel area 920 of the first optical area OA1.

Although not shown in the drawings, the anodes AE of the emitting devices ED disposed in the bezel area 920 of the first optical area OA1 may be electrically connected to the first transistors T1 disposed in the bezel area 920.

In addition, the anodes AE of the emitting devices ED disposed in the central area 910 of the first optical area OA1 may be electrically connected to the first transistors T1 disposed in the bezel area 920.

For example, as illustrated in FIGS. 11 to 14, at least one anode among the anodes AE disposed on the fourth planarization layer PLN4 in the central area 910 may be electrically connected to a connection pattern (e.g., the fifth connection pattern CP5) disposed on the second planarization layer PLN2 through a contact hole. Here, the connection pattern to which the anode AE is electrically connected may be a connection pattern in contact with the fifth source-drain electrode pattern SD5 of the first transistor T1 disposed in the bezel area 920, together with the first connection pattern CP1.

In addition, at least one anode of the anodes AE may be electrically connected to a connection pattern (e.g., the sixth connection pattern CP6) disposed on the third planarization layer PLN3 through a contact hole. Here, the connection pattern to which the anode AE is electrically connected may be a connection pattern in contact with the eighth source-drain electrode pattern SD8 of the first transistor T1 disposed in the bezel area 920, together with the second connection pattern CP2.

In this manner, the anodes AE disposed in the central area 910 and the bezel area 920 may be electrically connected to the first transistors T1 disposed in the bezel area 920.

In the normal area NA and the first optical area OA1, banks BANK not overlapping the emitting areas EA may be disposed on the fourth planarization layer PLN4.

The area in which the banks BANK are disposed may be a non-display area.

Although the anode AE of the emitting device ED is illustrated as having a single-layer structure in FIGS. 11 to 14, embodiments of the present disclosure are not limited thereto.

The anode AE may have a multilayer structure. For example, the anode AE may have a structure comprised of three layers, in which a reflective electrode is disposed between transparent conductive material layers.

As illustrated in FIGS. 11 to 14, the emitting layer EL and the cathode CE may be disposed on the anode AE.

The encapsulation layer ENCAP may be disposed on the cathode CE.

In addition, as illustrated in FIGS. 11 to 14, the touch buffer film T-BUF, the touch sensors TS, the touch interlayer insulating film T-ILD, and the passivation layer PAC may be disposed on the encapsulation layer ENCAP.

As illustrated in FIGS. 11 to 14, the touch sensors TS may be disposed in the normal area NA and the bezel area 920 of the first optical area OA1 but no touch sensors may be disposed in the central area 910. However, the display device according to embodiments of the present disclosure is not limited thereto, but the touch sensor TS may be disposed in a portion of the central area 910.

The touch sensor TS may be disposed not to overlap the emitting area EA of the display panel.

Although not shown in FIGS. 11 to 14, a color filter layer may be disposed on the touch sensor TS.

The color filter layer may be disposed to correspond the emitting area EA in the normal area NA.

However, the structure of the display device according to embodiments of the present disclosure is not limited thereto, but the color filter layer may be disposed to correspond to a portion of the emitting area EA in the first optical area OA1 as required. When the color filter layer is disposed in the first optical area OA1, the area, position, and thickness of the color filter layer may be variously selected in consideration of the transmittance of the first optical area OA1.

In addition, although the structure of the normal area NA and the first optical area OA1 has mainly been described with reference to FIGS. 11 to 14, the second optical area OA2 may also have a structure corresponding to the structure of the first optical area OA1.

In addition, referring to FIG. 12, none of the variety of patterns ACT, SD, and GATE, the variety of insulating films ABUF3, GI1, GI2, ILD1, ILD2, and the variety of metal patterns TM1, GM, and LS may be disposed in the central area 910 of the first optical area OA1.

In this case, since the transistor is not disposed in the central area 910 of the first optical area OA1, only the active connection pattern CP_ACT may be disposed on the second active buffer layer ABUF2.

By selective dry etching of the central area 910 during etching of the first transistors T1 disposed in the normal area NA and the bezel area 920 of the first optical area OA1, the inorganic materials, such as the insulating films (ABUF3, GI1, GI2, ILD1, ILD2, and PAS0, on the active connection pattern CP_ACT may be removed.

Thus, a stepped portion that may occur since none of the variety of insulating films ABUF3, GI1, GI2, ILD1, and ILD2 and the variety of metal patterns TM1, GM, and LS are disposed in the central area 910 may be planarized using the first planarization layer PLN1 formed of an organic material. When the first planarization layer PLN1 is depressed downward, the second planarization layer PLN2 may substantially perform a planarization function.

Figure 13:
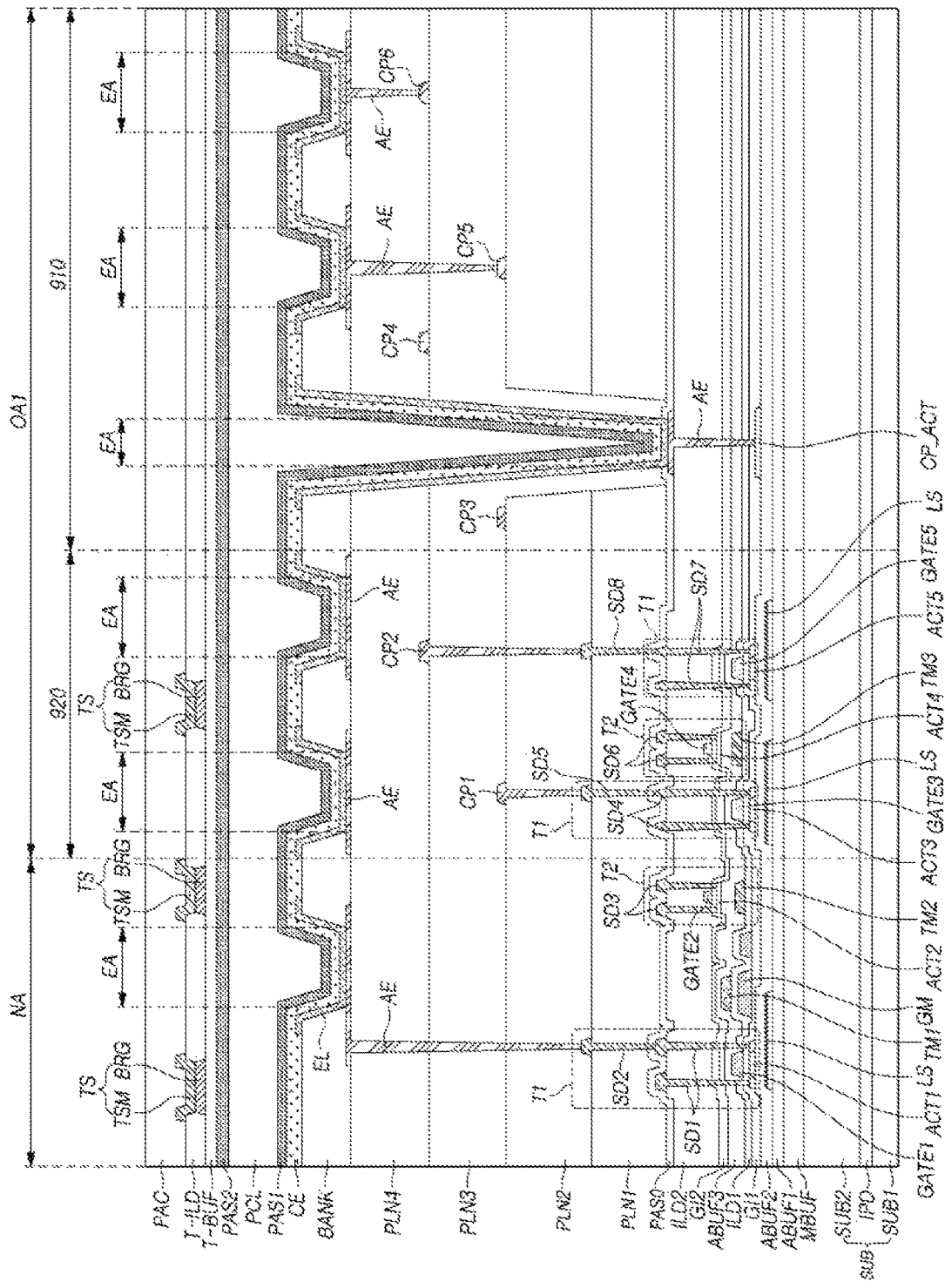

In addition, referring to FIG. 13, due to mask design of the planarization layer in the central area 910 of the first optical area OA1, the first to fourth planarization layers PLN1 to PLN4 formed of the organic material may be removed from above the active connection pattern CP_ACT.

Thus, the anodes AE of some of the emitting devices ED in the central area 910 may be disposed on the passivation layer PAS0 instead of being disposed on the fourth planarization layer PLN4 and may be connected to the active connection pattern CP_ACT through contact holes.

Figure 14:
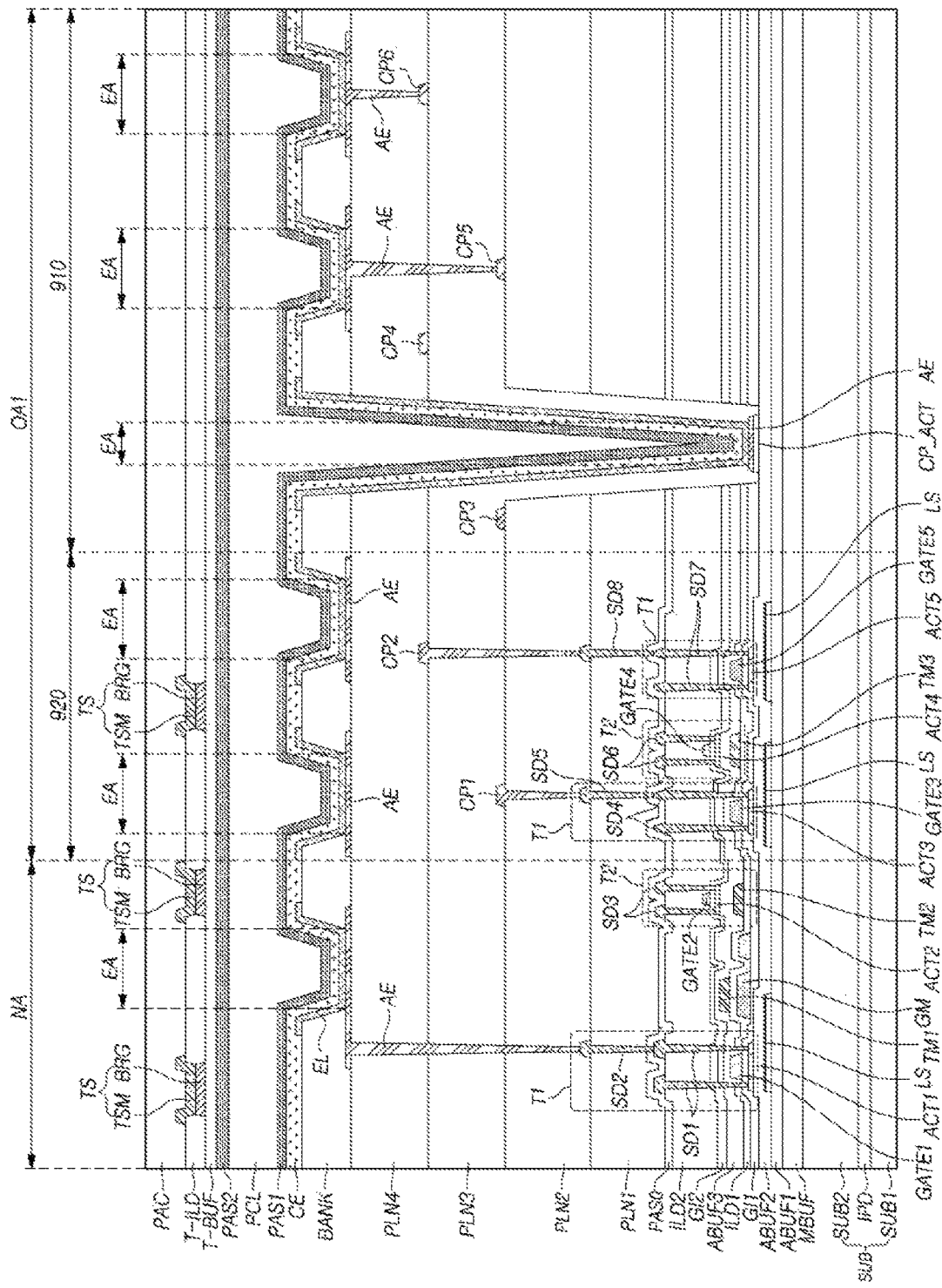

In addition, referring to FIG. 14, all of the insulating films ABUF3, GI1, GI2, ILD1, ILD2, and PAS0 formed of the inorganic material and the first to fourth planarization layers PLN1 to PLN4 formed of the organic material may be removed.

In this case, the anodes AE of some of the emitting devices ED may be in direct or indirect contact with the active connection pattern CP_ACT.

As illustrated in FIGS. 12 to 14, when the anodes AE of some of the emitting devices ED are connected to the first transistors T1 through the active connection pattern CP_ACT, the insulating films formed of the organic material and/or the inorganic material may be removed so as to reduce the depth of the contact holes. As illustrated in FIGS. 12 to 14, as the insulating films formed of the organic material and/or the inorganic material are removed, the number of the layers through which the connecting portions between the anodes AE and the active connection pattern CP_ACT pass may be reduced or the length of the connecting portions between the anodes AE and the active connection pattern CP_ACT may be reduced. Here, the connecting portions between the anodes AE and the active connection pattern CP_ACT may be portions of the anodes AE.

Accordingly, it is possible to minimize defects (e.g., a defective contact, a defective connection, or an increase in contact resistance) that may occur during a process such as etching for forming contact holes through which the anodes AE of the emitting devices ED are connected to the active connection pattern CP_ACT.

The display device according to embodiments of the present disclosure as described above may also be briefly described as follows.

The display device according to embodiments of the present disclosure may include: a substrate including a display area including a first optical area, the first optical area including a central area and a bezel area located outside of the central area, and a normal area located outside of the first optical area; a plurality of emitting devices disposed on the substrate in the central area; a plurality of emitting devices disposed on the substrate in the bezel area; a plurality of transistors disposed on the substrate in the bezel area and including a plurality of source-drain electrode patterns and a plurality of active layers; and a connection pattern formed of the same material as at least one active layer among the plurality of active layers and connected to at least one emitting device among the plurality of emitting devices disposed in the central area.

In the display device according to embodiments of the present disclosure, at least two emitting devices among the plurality of emitting devices may share a single connection pattern. In other words, the at least two emitting devices may be commonly connected to the single connection pattern. That is, anodes of the at least two emitting devices may be commonly connected to the single connection pattern.

In the display device according to embodiments of the present disclosure, the at least two emitting devices sharing the single connection pattern may have emitting areas from which the same color of light is emitted.

In the display device according to embodiments of the present disclosure, each of the plurality of emitting devices may include: an anode containing a transparent conductive material; a cathode provided in common in the plurality of emitting devices; and an emitting layer disposed between the anode and the cathode. That is, each of the plurality of emitting devices disposed in the central area and the plurality of emitting devices disposed in the bezel area may include the anode containing the transparent conductive material, the cathode overlapping the anode, and the emitting layer between the anode and the cathode.

In the display device according to embodiments of the present disclosure, the connection pattern may be formed on the same layer as the at least one active layer among the plurality of active layers. That is, the connection pattern may equally contain a semiconductor material contained in the at least one active layer among the plurality of active layers. For example, the connection pattern may be a conductorized pattern of the semiconductor material. The semiconductor material may include a low-temperature polysilicon semiconductor material or an oxide semiconductor material.

In the display device according to embodiments of the present disclosure, the plurality of active layers may include a first active layer and a second active layer. The first active layer and the second active layer may be different layers. The connection pattern may be provided on the same layer as one of the first active layer and the second active layer.

For example, the first active layer may be located lower than the second active layer. At least one insulating layer may be disposed between the first active layer and the second active layer. The connection pattern may be disposed on the same layer as the second active layer located lower than the first active layer.

For example, the first active layer and the second active layer may contain different semiconductor materials. The first active layer may contain a first semiconductor material, and the second active layer may contain a second semiconductor material different from the first semiconductor material. The connection pattern may be provided on the same layer as the first active layer containing the first semiconductor material. For example, the first semiconductor material may be a low-temperature polysilicon semiconductor material, while the second semiconductor material may be an oxide semiconductor material. Alternatively, the first semiconductor material may be an oxide semiconductor material, while the second semiconductor material may be a low-temperature polysilicon semiconductor material.

In the display device according to embodiments of the present disclosure, some transistors among the plurality of transistors disposed in the bezel area may be electrically connected to at least one emitting device among the plurality of emitting devices disposed in the bezel area, and the remaining transistors among the plurality of transistors disposed in the bezel area may be electrically connected to at least one emitting device among the plurality of emitting devices disposed in the central area.

In the display device according to embodiments of the present disclosure, the source-drain electrode patterns may contain an opaque metal, and the connection pattern may contain a transparent conductive material.

In the display device according to embodiments of the present disclosure, the plurality of source-drain electrode patterns may include a first source-drain electrode pattern and a second source-drain electrode pattern. The second source-drain electrode pattern may be located on a different layer from the first source-drain electrode pattern.

The display device according to embodiments of the present disclosure may further include: a first insulating film on the substrate; and a second insulating film on the first insulating film. The first source-drain electrode pattern may be disposed on the first insulating film, the second insulating film may be disposed on the first source-drain electrode pattern, and the second source-drain electrode pattern may be disposed on the second insulating film. The second source-drain electrode pattern may be connected to the first source-drain electrode pattern. That is, the second source-drain electrode pattern may be connected to the first source-drain electrode pattern through a through-hole in the second insulating film.

The display device according to embodiments of the present disclosure may further include: a third insulating film disposed on the second insulating film; and a first connection pattern disposed on the third insulating film. The first connection pattern may be disposed in the bezel area and connected to the second source-drain electrode pattern. That is, the first connection pattern may be located in the bezel area, and the first connection pattern may be connected to the second source-drain electrode pattern through a through-hole in the third insulating film.

The display device according to embodiments of the present disclosure may further include a third connection pattern disposed on the same layer as the first connection pattern. The third connection pattern may be located in the central area. The third connection pattern may be electrically connected to an anode of at least one emitting device among the plurality of emitting devices disposed in the central area.

The display device according to embodiments of the present disclosure may further include: a third insulating film disposed on the second insulating film; a fourth insulating film disposed on the third insulating film; and a second connection pattern disposed on the fourth insulating film. The second connection pattern may be located in the bezel area and connected to the second source-drain electrode pattern. That is, the second connection pattern may be located in the bezel area and connected to the second source-drain electrode pattern through a through-hole in the third insulating film and the fourth insulating film.

The display device according to embodiments of the present disclosure may further include a fourth connection pattern disposed on the same layer as the second connection pattern. The fourth connection pattern may be located in the central area and electrically connected to an anode of at least one emitting device among the plurality of emitting devices disposed in the central area.

The display device according to embodiments of the present disclosure may further include: an encapsulation layer disposed to cover the plurality of emitting devices disposed in the central area and the plurality of emitting devices disposed in the bezel area; a touch buffer film disposed on the encapsulation layer; and a touch sensor disposed on the touch buffer film.

The display device according to embodiments of the present disclosure may further include a color filter layer disposed on the touch sensor.

In the display device according to embodiments of the present disclosure, the plurality of transistors may include a first transistor and a second transistor disposed on different layers. The active layer of the first transistor and the active layer of the second transistor may be located on different layers. The connection pattern may contain the same material as one of the active layer of the first transistor and the active layer of the second transistor.

In the display device according to embodiments of the present disclosure, the first transistor may be a low-temperature polysilicon thin-film transistor, and the second transistor may be an oxide semiconductor thin-film transistor.

The display device according to embodiments of the present disclosure may further include a first optoelectronic device located below a display panel and overlapping at least a portion of the first optical area included in the display area.

In the display device according to embodiments of the present disclosure, the display area may further include a second optical area different from the first optical area and the normal area. The display device may further include a second optoelectronic device disposed below the display panel and overlapping at least a portion of the second optical area. The normal area may or may not be disposed between the first optical area and the second optical area.

The display panel according to embodiments of the present disclosure may include: a substrate including a display area including a first optical area, the first optical area including a central area and a bezel area located outside of the central area, and a normal area located outside of the first optical area; a plurality of emitting devices disposed in the central area; a plurality of emitting devices disposed in the bezel area; a plurality of transistors disposed in the bezel area and including a plurality of source-drain electrode patterns and a plurality of active layers; and a connection pattern formed of the same material as at least one active layer among the plurality of active layers and connected to at least one emitting device among the plurality of emitting devices disposed in the central area.

In the display panel and the display device having the above-described structure according to embodiments of the present disclosure, the plurality of transistors are disposed in the bezel area of the optical area, and no transistors are disposed in the central area of the optical area.

With this configuration, the transmittance of the central area may be improved.

In addition, in the display panel and the display device according to embodiments of the present disclosure, the active connection pattern is formed in the central area of the first optical area, concurrently in the process of forming the first active layer in the normal area and the third active layer and the fifth active layer in the bezel area. Accordingly, the thickness may be reduced, and the process may be simplified.

As set forth above, embodiments of the present disclosure have been described in more detail with reference to the accompanying drawings. However, the present disclosure is not limited to the foregoing embodiments but a variety of modifications are possible without departing from the principle of the present disclosure. Thus, the foregoing embodiments disclosed herein should be interpreted as being illustrative, while not being limitative, of the principle and scope of the present disclosure. Therefore, the foregoing embodiments should be construed as being non-exhaustive in all aspects. The scope of the present disclosure should be construed based on the appended Claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
    a substrate having a display area that includes a first optical area, the first optical area including a central area, a bezel area located outside of the central area, and the display area also including a normal area located outside of the first optical area;
    a plurality of light emitting devices disposed on the substrate in the central area;
    a plurality of light emitting devices disposed on the substrate in the bezel area;
    a plurality of transistors disposed on the substrate in the bezel area, each transistor having a source-drain electrode pattern and a first active layer; and
    a connection pattern formed of the same material as the first active layer, the connection pattern extending between a first light emitting device and a second light emitting device among the plurality of light emitting devices disposed in the central area to electrically connect them to each other.

2. The display device according to claim 1, wherein the at least first and second light emitting devices sharing the connection pattern have light emitting areas from which the same color of light is emitted.

3. The display device according to claim 1, further comprising a second active layer, the first active layer and the second active layer being different layers.

4. The display device according to claim 1, wherein a first set of transistors among the plurality of transistors disposed in the bezel area are electrically connected to at least one light emitting device among the plurality of light emitting devices disposed in the bezel area, and
    a second set of transistors among the plurality of transistors disposed in the bezel area are electrically connected to at least one light emitting device among the plurality of light emitting devices disposed in the central area.

5. The display device according to claim 1, wherein the source-drain electrode patterns comprise an opaque metal, and the connection pattern comprises a transparent conductive material.

6. The display device according to claim 1, wherein the connection pattern comprises a stack of having a semiconductor material layer and a transparent conductive material layer.

7. The display device according to claim 1, wherein the connection pattern comprises a solely a semiconductor material layer.

8. The display device according to claim 1, wherein the plurality of source-drain electrode patterns comprise:
    a first source-drain electrode pattern; and
    a second source-drain electrode pattern located on a different layer from the first source-drain electrode pattern.

9. The display device according to claim 8, wherein the display panel further comprises:
    a first insulating film on the substrate; and
    a second insulating film on the first insulating film,
    wherein the first source-drain electrode pattern is disposed on the first insulating film,
    the second insulating film is disposed on the first source-drain electrode pattern,
    the second source-drain electrode pattern is disposed on the second insulating film, and the second source-drain electrode pattern is connected to the first source-drain electrode pattern.

10. The display device according to claim 9, wherein the display panel further comprises:
   a third insulating film disposed on the second insulating film; and
   a first connection pattern disposed on the third insulating film,
   wherein the first connection pattern is disposed in the bezel area and connected to one second source-drain electrode pattern.

11. The display device according to claim 9, wherein the display panel further comprises a third connection pattern disposed on the same layer as the first connection pattern,
   wherein the third connection pattern is located in the central area and electrically connected to an anode of at least one light emitting device among the plurality of light emitting devices disposed in the central area.

12. The display device according to claim 9, wherein the display panel further comprises:
   a third insulating film disposed on the second insulating film;
   a fourth insulating film disposed on the third insulating film; and
   a second connection pattern disposed on the fourth insulating film,
   wherein the second connection pattern is located in the bezel area and connected to one second source-drain electrode pattern.

13. The display device according to claim 9, wherein the display panel further comprises a fourth connection pattern disposed on the same layer as the second connection pattern,
   wherein the fourth connection pattern is located in the central area and electrically connected to an anode of at least one light emitting device among the plurality of light emitting devices disposed in the central area.

14. The display device according to claim 1, wherein the display panel further comprises:
   an encapsulation layer disposed to cover the plurality of light emitting devices disposed in the central area and the plurality of light emitting devices disposed in the bezel area;
   a touch buffer film disposed on the encapsulation layer; and
   a touch sensor disposed on the touch buffer film.

15. The display device according to claim 14, wherein the display panel further comprises a color filter layer disposed on the touch sensor.

16. The display device according to claim 1, wherein the plurality of transistors comprise a first transistor and a second transistor disposed on different layers.

17. The display device according to claim 16, wherein the first transistor is a low-temperature polysilicon thin-film transistor,
   the second transistor is an oxide semiconductor thin-film transistor,
   the active layer of the first transistor and the active layer of the second transistor are located on different layers, and
   the connection pattern comprises the same material as at least one of the active layer of the first transistor and the active layer of the second transistor.

18. The display device according to claim 1, further comprising a first optoelectronic device located below the display panel and overlapping at least a portion of the first optical area included in the display area.

19. The display device according to claim 1, wherein the display area further comprises:
   a second optical area different from the first optical area and the normal area; and
   a second optoelectronic device disposed below the display panel and overlapping at least a portion of the second optical area,
   wherein the normal area is disposed between the first optical area and the second optical area.

20. The display device according to claim 1, wherein the display area further comprises:
   a second optical area different from the first optical area and the normal area; and
   a second optoelectronic device disposed below the display panel and overlapping at least a portion of the second optical area,
   wherein the normal area is not disposed between the first optical area and the second optical area.

21. The display device according to claim 10, wherein the first connection pattern is disposed to extend to the central area.

22. The display device according to claim 10, wherein the first connection pattern and the one second source-drain electrode pattern are in contact with each other through a contact hole formed in the third insulating film.

23. The display device according to claim 12, wherein the second connection pattern is disposed to extend to the central area.

24. The display device according to claim 23, wherein the display panel further a fifth insulating film disposed on the fourth insulating film; and
   a fifth connection pattern disposed on the third insulating film,
   wherein at least one anode among the anodes of the plurality of light emitting devices disposed on the fifth insulating film in the central area is electrically connected to the fifth connection pattern through a contact hole formed in the fourth and fifth insulating films.

25. The display device according to claim 14, wherein the touch sensor includes touch sensor metals and a bridge metal located on different layers, and wherein a touch interlayer insulation film is disposed between the touch sensor metals and the bridge metal.

26. The display device according to claim 25, wherein the touch sensor metals include a first touch sensor metal, a second touch sensor metal, and a third touch sensor metal disposed adjacent to each other,
   wherein the third touch sensor metal is present between the first touch sensor metal and the second touch sensor metal, the first touch sensor metal and the second touch sensor metal are electrically connected to each other through the bridge metal located on a different layer, and the bridge metal is insulated from the third touch sensor metal by the touch interlayer insulating film.

27. A display panel, comprising:
   a substrate;
   a display area including a first optical area, the first optical area including a central area and a bezel area located outside of the central area, and the display area including a normal area located outside of the first optical area;
   a plurality of light emitting devices disposed in the central area;
   a plurality of light emitting devices disposed in the bezel area;

a plurality of transistors disposed in the bezel area and having a plurality of source-drain electrode patterns and at least one active layer; and a connection pattern formed of the same material as the at least one active layer and connected to at least one light emitting device among the plurality of light emitting devices disposed in the central area.

28. The display panel according to claim 27, wherein the first optical area includes light emitting areas and first transmission areas, and the first transmission areas do not include a material layer having electrical conductive properties.

29. A display device comprising:

a substrate;

a display area positioned on the substrate;

a first optical area position in the display area on substrate;

a central area within the first optical area;

a first bezel area within the first optical area that is different from the central area;

a normal area position in the display area and located outside of the first optical area;

a plurality of light emitting devices disposed on the substrate in the central area;

a plurality of light emitting devices disposed on the substrate in the first bezel area;

a plurality of transistors disposed on the substrate in the first bezel area, each transistor having a source-drain electrode pattern and a first active layer; and a connection pattern positioned in the central area and formed of the same material as the first active layer, the connection pattern extending between a first light emitting device and a second light emitting device among the plurality of light emitting devices disposed in the central area to electrically connect them to each other.

30. The display device of claim 29 further including:

a non-display area adjacent to the display area;

a second bezel area in the non-display area, the second bezel area not containing light emitting devices.

31. The display device of claim 29 wherein the connection pattern positioned in the central area includes two layers, a first layer having the same material as the first active layer and the second layer including a transparent metal conductor layer.

* * * * *